(12) United States Patent
Lee et al.

(10) Patent No.: US 12,384,169 B2
(45) Date of Patent: Aug. 12, 2025

(54) INKJET PRINTING APPARATUS

(71) Applicant: Samsung Display Co., LTD., Yongin-si (KR)

(72) Inventors: Byung Chul Lee, Hwaseong-si (KR); Heung Cheol Jeong, Hwaseong-si (KR); Myung Soo Huh, Suwon-si (KR); Jin Oh Kwag, Yongin-si (KR); Do Hun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 116 days.

(21) Appl. No.: 18/013,633

(22) PCT Filed: Jun. 4, 2021

(86) PCT No.: PCT/KR2021/007004
§ 371 (c)(1),
(2) Date: Dec. 29, 2022

(87) PCT Pub. No.: WO2022/005033
PCT Pub. Date: Jan. 6, 2022

(65) Prior Publication Data
US 2023/0286292 A1    Sep. 14, 2023

(30) Foreign Application Priority Data

Jun. 29, 2020 (KR) .......................... 10-2020-0079068

(51) Int. Cl.
*B41J 11/00* (2006.01)
*B41M 7/00* (2006.01)
*H10K 71/13* (2023.01)

(52) U.S. Cl.
CPC .......... *B41J 11/0015* (2013.01); *B41J 11/005* (2013.01); *B41M 7/0072* (2013.01); *H10K 71/135* (2023.02)

(58) Field of Classification Search
CPC ..................................................... B41J 2202/09
See application file for complete search history.

(56) References Cited

U.S. PATENT DOCUMENTS

| | | | |
|---|---|---|---|
| 2006/0054774 A1* | 3/2006 | Yassour | F16C 32/06 248/631 |
| 2007/0026646 A1* | 2/2007 | Chae | H10K 10/466 438/479 |

(Continued)

FOREIGN PATENT DOCUMENTS

| | | |
|---|---|---|
| CN | 103828085 | 5/2014 |
| CN | 106795387 | 5/2017 |

(Continued)

OTHER PUBLICATIONS

Written Opinion, with English translation, corresponding to International Application No. PCT/KR2021/007004, dated Sep. 2, 2021.

(Continued)

*Primary Examiner* — Shelby L Fidler
(74) *Attorney, Agent, or Firm* — KILE PARK REED & HOUTTEMAN PLLC

(57) ABSTRACT

An inkjet printing apparatus includes: an airflow stage extending in a first direction; a print head unit disposed above the airflow stage; and an electric field generating unit that moves in the first direction and generates electric field above the airflow stage.

22 Claims, 36 Drawing Sheets

(56) References Cited

U.S. PATENT DOCUMENTS

| | | | |
|---|---|---|---|
| 2008/0099129 A1 | 5/2008 | Kuriyama et al. | |
| 2012/0113181 A1 | 5/2012 | Kwon et al. | |
| 2018/0014411 A1* | 1/2018 | Vronsky | H10K 77/00 |
| 2020/0180329 A1* | 6/2020 | Pun | B41J 11/58 |

FOREIGN PATENT DOCUMENTS

| | | |
|---|---|---|
| KR | 10-2012-0047628 | 5/2012 |
| KR | 10-2017-0003756 | 1/2017 |
| KR | 10-2018-0082667 | 7/2018 |
| KR | 10-2018-0107325 | 10/2018 |
| KR | 10-2020-0034905 | 4/2020 |
| WO | 2020-059994 | 3/2020 |
| WO | 2020-141652 | 7/2020 |

OTHER PUBLICATIONS

International Search Report, with English translation, corresponding to International Application No. PCT/KR2021/007004 dated Sep. 2, 2021.

\* cited by examiner

INKJET PRINTING APPARATUS

CROSS REFERENCE TO RELATED APPLICATION(S)

This application is a national entry of International Application No. PCT/KR2021/007004, filed on Jun. 4, 2021, which claims under 35 U.S.C. §§ 119(a) and 365(b) priority to and benefits of Korean Patent Application No. 10-2020-0079068, filed on Jun. 29, 2020, in the Korean Intellectual Property Office (KIPO), the entire content of which are incorporated herein by reference.

BACKGROUND

1. Technical Field

Embodiments relate to an inkjet printing apparatus.

2. Description of the Related Art

The importance of display devices has steadily increased with the development of multimedia technology. Thus, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) formed of an organic material as a fluorescent material and an inorganic light emitting diode formed of an inorganic material as a fluorescent material.

SUMMARY

To address the aforementioned problems, embodiments provide an inkjet printing apparatus capable of performing a printing process of spraying ink onto a target substrate at high speed by floating the target substrate up in the air over a stage and moving the target substrate in a horizontal direction.

Embodiments also provide an inkjet printing apparatus capable of improving the accuracy of alignment of dipole elements by moving an electric field generating unit that generates an electric field on a target substrate, in accordance with the movement of the target substrate.

However, embodiments of the disclosure are not limited to those set forth herein. The above and other embodiments will become more apparent to one of ordinary skill in the art to which the disclosure pertains by referencing the detailed description of the disclosure given below.

According to an embodiment, an inkjet printing apparatus may include an airflow stage extending in a first direction, a print head unit disposed above the airflow stage, and an electric field generating unit that moves in the first direction and generates an electric field on the airflow stage.

The print head unit may include a print head, and the print head may include nozzles that spray ink including dipoles.

The print head may be configured to spray the ink onto the airflow stage on which the electric field is formed.

The airflow stage may include a plurality of air holes formed on an upper surface of the airflow stage, and at least some of the plurality of air holes may be configured to discharge air onto the airflow stage.

The inkjet printing apparatus may further include a substrate transferring unit that transfers a target substrate in the first direction over the airflow stage.

The substrate transferring unit may include a first substrate transferrer disposed adjacent to a first side of the airflow stage in a second direction perpendicular to the first direction.

The first substrate transferrer may further include a gripper, and the gripper may be configured to adsorb the target substrate onto a surface of the gripper by generating negative pressure between the gripper and the target substrate.

The substrate transferring unit may further include a second substrate transferrer disposed adjacent to a second side of the airflow stage opposite to the first side of the airflow stage.

The electric field generating unit may be configured to generate an electric field on the target substrate in case that the target substrate moves along with the substrate transferring unit.

The electric field generating unit may include a probe unit and a probe driving device that drives the probe unit.

According to an embodiment, an inkjet printing apparatus may include an airflow stage extending in the first direction, the airflow stage including a loading part sequentially arranged in a first direction, the loader part in which a target substrate is aligned, and a printing part that sprays ink onto the target substrate, a print head unit disposed above the printing part, and an electric field generating unit disposed on a side of the airflow stage and that generates an electric field on the target substrate in case that the target substrate moves in the first direction.

The inkjet printing apparatus may further include a substrate transferring unit that transfers the target substrate in the first direction over the airflow stage.

The substrate transferring unit may be disposed adjacent to a first side of the airflow stage in a second direction perpendicular to the first direction.

The substrate transferring unit may further include a gripper, and the gripper may be configured to adsorb a surface of the target substrate onto a surface of the gripper facing the surface of the target substrate by generating negative pressure between the gripper and the target substrate.

The electric field generating unit may be configured to generate an electric field on the target substrate in case that the target substrate moves along with the substrate transferring unit.

The electric field generating unit may include a probe unit and a probe driving device that drives the probe unit.

The airflow stage may include a plurality of air holes that lift up the target substrate by discharging the air onto the airflow stage.

The inkjet printing apparatus may further include an alignment checking unit disposed above the loading part.

The inkjet printing apparatus may further include a first guide unit extending in the first direction and disposed adjacent to a first side of the airflow stage in a second direction perpendicular to the first direction, wherein the electric field generating unit may include a first base substrate disposed on the first guide unit, a probe unit disposed on the first base substrate, and a probe driving device spaced apart from the probe unit and disposed on the first base substrate.

The inkjet printing apparatus may further include a second guide unit extending in the first direction and disposed between the first guide unit and the airflow stage, and a substrate transferring unit that transfers the target substrate along the second guide unit over the airflow stage, wherein the substrate transferring unit may include a second base substrate disposed on the second guide unit, and a gripper disposed on the second base substrate and fixing the target substrate.

The inkjet printing apparatus may further include a gripper disposed on the first base substrate, the gripper that transfers the target substrate in the first direction.

The details of other embodiments are included in the detailed description and the accompanying drawings.

According to embodiments, a printing process of spraying ink onto a target substrate may be performed at high speed by floating the target substrate up in the air over a stage and moving the target substrate in a horizontal direction, and as a result, the duration of the printing process may be shortened.

For example, the accuracy of alignment of dipole elements may be improved by moving an electric field generating unit that generates an electric field on the target substrate, in accordance with the movement of the target substrate, and as a result, a display device with an improved reliability may be provided.

The effects according to the embodiments are not limited by the contents described above, and more various effects are included in this disclosure.

DETAILED DESCRIPTION OF THE EMBODIMENTS

Figure 1:
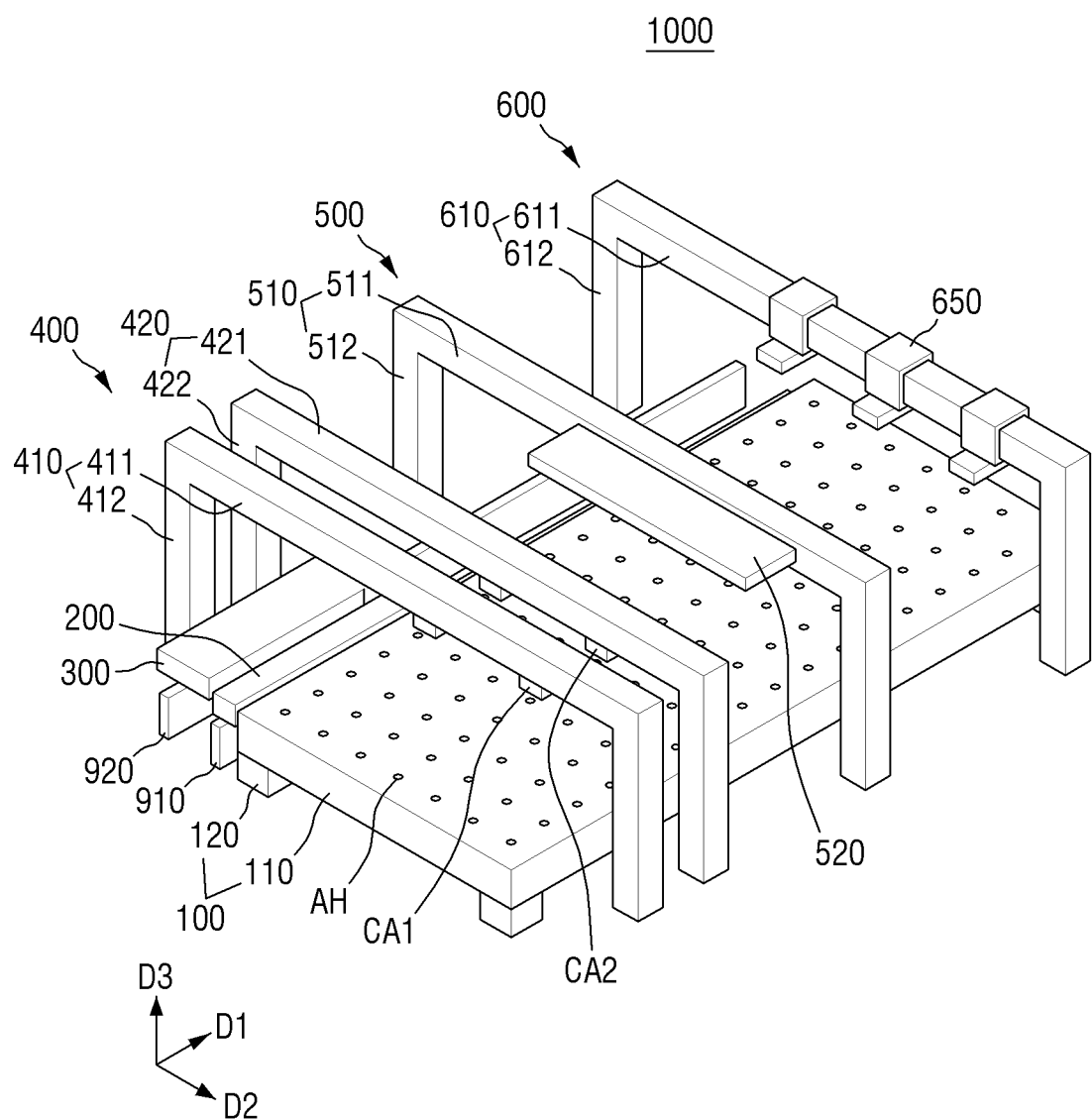
FIG. 1 is a schematic perspective view of an inkjet printing apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the X, Y, and Z-axes, and may be interpreted in a broader sense. For example, the D1-axis, the D2-axis, and the D3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, V, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 2:
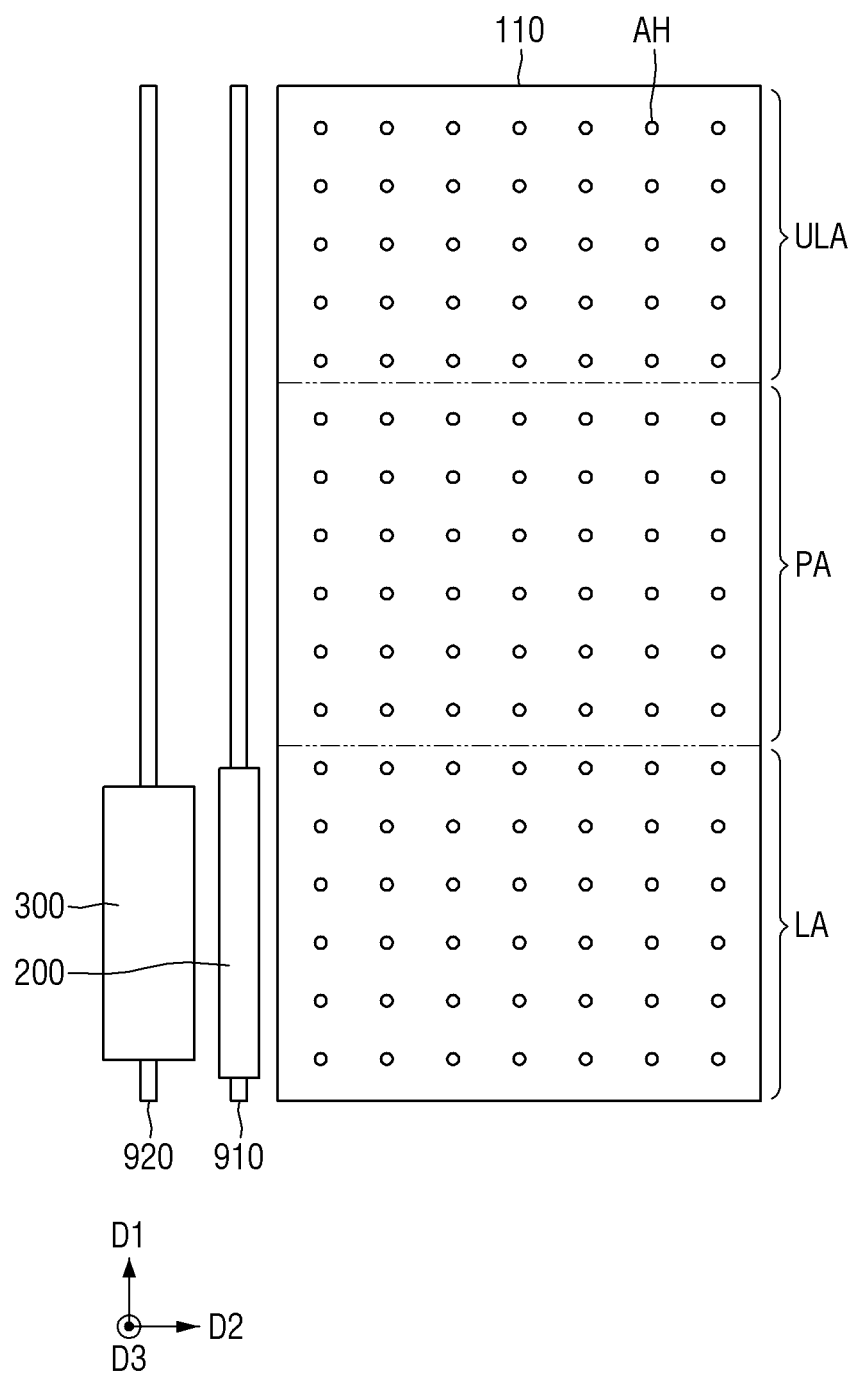
FIG. 2 is a schematic layout view illustrating the layout of an airflow stage, a support unit, and an electric field generating unit according to an embodiment.
Figure 3:
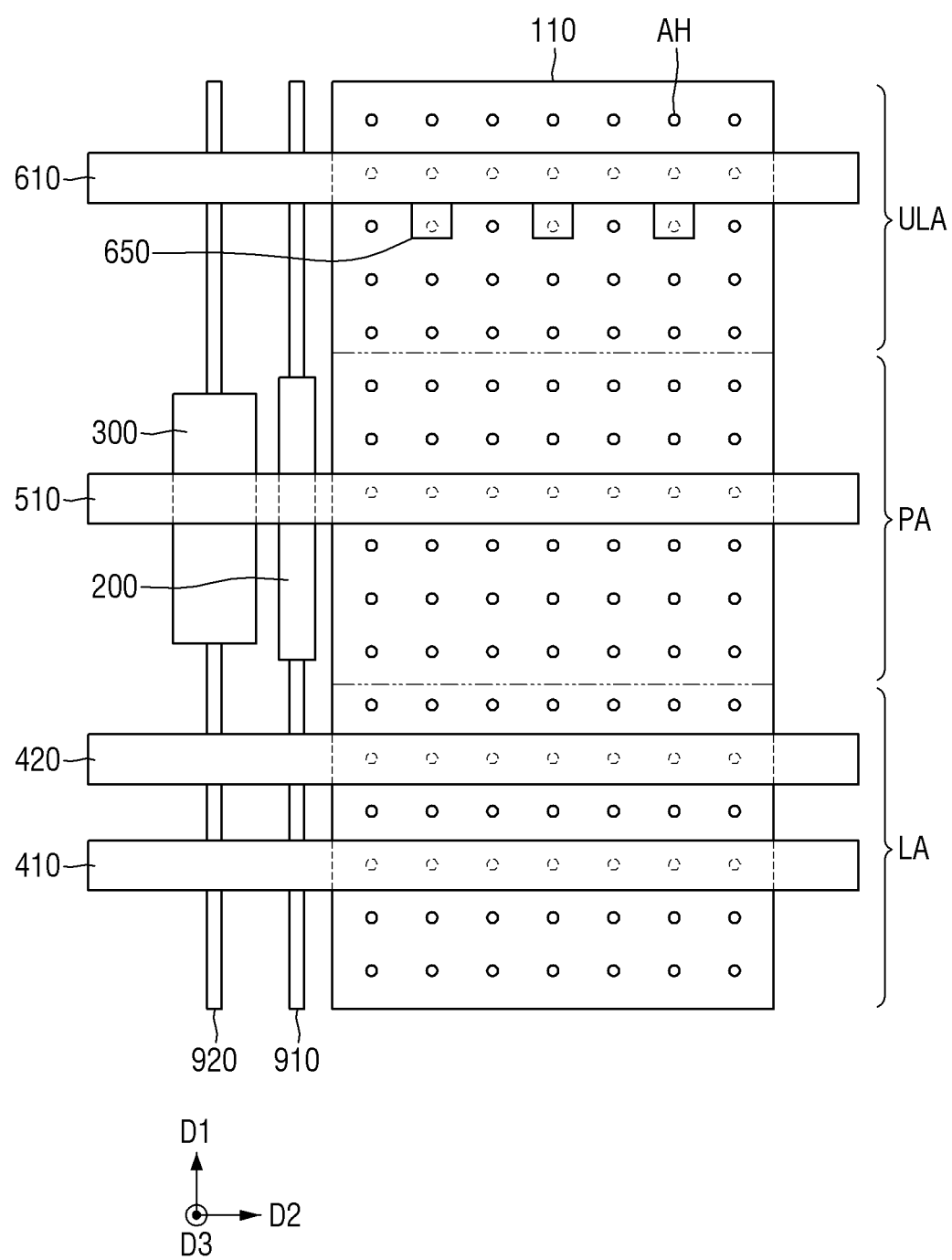
FIG. 3 is a schematic plan view of the inkjet printing apparatus according to an embodiment.

FIG. 1 is a schematic perspective view of an inkjet printing apparatus according to an embodiment. FIG. 2 is a schematic layout view illustrating the layout of an airflow stage, a support unit, and an electric field generating unit according to an embodiment. FIG. 3 is a schematic plan view of the inkjet printing apparatus according to an embodiment.

An inkjet printing apparatus 1000 according to an embodiment may spray ink onto a target substrate SUB in case that the target substrate SUB moves in a direction with an electric field generated thereon. As an electric field is formed on the target substrate SUB, particles dispersed in the ink, i.e., dipoles, may be aligned and may be sprayed onto the target substrate SUB.

First, second, and third directions D1, D2, and D3 are defined as illustrated. The first and second directions D1 and D2 may be directions that reside on one plane and are orthogonal to each other, and the third direction D3 may be orthogonal to each of the first and second directions D1 and D2.

Unless specified otherwise, the term "top" or "upper" refers to a first side in the third direction D3, and the term "top surface" or "upper surface" refers to a surface in the first side in the third direction D3. Also, the term "bottom" or "lower" refers to a second side in the third direction D3, and the term "bottom surface" or "lower surface" refers to a surface in the second in the third direction D3. Also, the terms "left", "right", "upper", and "lower" refer to their respective directions in case that the inkjet printing apparatus 1000 is viewed from thereabove. For example, the term "left" refers to the opposite direction to the second direction D2, the term "right" refers to the second direction D2, the term "upper" refers to the first direction D1, and the term "lower" refers to the opposite direction to the first direction D1.

Referring to FIGS. 1 through 3, the inkjet printing apparatus 1000 may include a stage unit 100, a substrate transferring unit 200, an electric field generating unit 300, an alignment checking unit 400, a print head unit 500, and an ejection amount checking unit 600. The inkjet printing apparatus 1000 may further include guide units (e.g., 910 and 920).

The stage unit 100 may include an airflow stage 110. The stage unit 100 may further include base frame 120, which is disposed below the airflow stage 110 and supports the airflow stage 110, but embodiments are not limited thereto. In another example, the base frame 120 may be omitted.

The airflow stage 110 may provide space in which a target substrate SUB is disposed. The target substrate SUB may be disposed on the top surface (or upper surface) of the airflow stage 110. The target substrate SUB may be moved in a direction over the stage unit 100 during a printing process.

The airflow stage 110 may lift up the target substrate SUB in the third direction D3 (or a vertical direction) by spraying the air onto the bottom surface (or lower surface) of the target substrate SUB disposed on the airflow stage 110. The target substrate SUB may be moved in the first direction D1 (or a horizontal direction) over the airflow stage 110 during a printing process, in case that the target substrate SUB is lifted up above the airflow stage 110.

The airflow stage 110 may have a rectangular shape having long sides in the first direction D1 and short sides in the second direction D2. The direction of the long sides of the airflow stage 110, i.e., the first direction D1, may be the direction in which the target substrate SUB is moved during a printing process. For example, the airflow stage 110 may have a rectangular shape that extends in the direction in which the target substrate SUB is moved during a printing process, i.e., in the first direction D1, but embodiments are not limited thereto. In another example, the airflow stage 110 may have various shapes such as an elliptical shape or a polygonal shape that extends in the first direction D1.

The airflow stage 110 may include a loading part LA, a printing part PA, and an unloading part ULA. The unloading part ULA may be spaced apart in the first direction D1 from the loading part LA. The printing part PA may be disposed between the loading part LA and the unloading part ULA. For example, the loading part LA, the printing part PA, and the unloading part ULA may be sequentially arranged along the first direction D1.

The loading part LA may be an area where the target substrate SUB is disposed on the airflow stage 110 for a printing process. For example, the target substrate SUB may be an area where target substrate SUB is loaded from the outside and the alignment of the target substrate SUB on the airflow stage 110 is performed for the printing process. For example, a moving unit, which moves the target substrate SUB over to the airflow stage 110 from the outside, may be further provided.

The printing part PA may be an area where the printing process is performed on the target substrate SUB via the print head unit 500.

The unloading part ULA may be an area where the target substrate SUB is released to the outside after the printing process. For example, the unloading part ULA may be an area where the amount and the landing positions of ink droplets sprayed by the print head unit 500 are checked via the ejection amount checking unit 600.

Air holes AH may be formed on the surface of the airflow stage 110. The air holes AH may be formed on the surface of each of the loading part LA, the printing part PA, and the unloading part ULA of the airflow stage 110. The air holes AH may control the target substrate SUB to be lifted up by as much as a certain height (hereinafter, the floating height) from the airflow stage 110 by discharging or sucking the air between the airflow stage 110 and the target substrate SUB. For example, some of the air holes AH may discharge the air from the airflow stage 110 onto the bottom surface (or lower surface) of the target substrate SUB, and some of the air holes AH may suck the air in the space between the airflow stage 110 and the target substrate SUB. The airflow stage 110 may control the floating height of the target substrate SUB by controlling the pressure of the air discharged through the air holes AH, between the airflow stage 110 and the target substrate SUB, and the pressure of the air sucked through the air holes AH, between the airflow stage 110 and the target substrate SUB.

The guide units (e.g., 910 and 920) may be disposed on a side of the airflow stage 110. The substrate transferring unit 200 and the electric field generating unit 300 that will be described below may be disposed on the guide units (e.g., 910 and 920). The guide units (e.g., 910 and 920) may extend in the first direction D1 and may move the substrate transferring unit 200 and the electric field generating unit 300 in the first direction D1. The guide units (e.g., 910 and 920) may function as guides for moving the substrate transferring unit 200 and the electric field generating unit 300 in the first direction D1.

The guide units (e.g., 910 and 920) may include first and second guide units (e.g., 910 and 920).

The first guide unit 910 may be disposed on a side of the stage unit 100. The first guide unit 910 may be disposed on the left side of the airflow stage 110, in a plan view. The first guide unit 910 is illustrated as being spaced apart from the airflow stage 110, but embodiments are not limited thereto. In another example, the first guide unit 910 may be attached (or coupled) to a side surface (e.g., the left side surface) of the airflow stage 110.

The first guide unit 910 may extend in the first direction D1. The direction in which the first guide unit 910 extends may be the same as the direction in which the airflow stage 110 extends. The substrate transferring unit 200 may be disposed on the first guide unit 910. The substrate transferring unit 200 may be disposed on the first guide unit 910 and may thus be movable along the first direction D1 by the first guide unit 910.

The second guide unit 920 may be disposed on a side of the stage unit 100. The second guide unit 920 may be disposed on the left side of the airflow stage 110, in a plan view. The first guide unit 910 may be disposed between the second guide unit 920 and the stage unit 100, e.g., in the second direction D2.

The second guide unit 920 may extend in the first direction D1. The direction in which the second guide unit 920 extends may be the same as the direction in which the airflow stage 110 extends. The electric field generating unit 300 may be disposed on the first guide unit 910. The electric field generating unit 300 may be disposed on the second guide unit 920 and may thus be movable along the first direction D1 by the second guide unit 920.

During the printing process, the substrate transferring unit 200 may move the target substrate SUB in the first direction D1 with maintaining the target substrate SUB a certain height on the stage unit 100.

The substrate transferring unit 200 may be disposed on the outside of, and near, a first long side (e.g., the left side in a plan view) of the airflow stage 110. The substrate transferring unit 200 may be disposed on at least one side of the airflow stage 110. One substrate transferring unit 200 is illustrated as being disposed on the outside of, and near, a side of the airflow stage 110. In another example, more than one substrate transferring unit 200 may be provided.

The substrate transferring unit 200 may be disposed on the first guide unit 910. The substrate transferring unit 200 may be disposed on the first guide unit 910 and may thus be movable along the first direction D1, but embodiments are not limited thereto. In another example, the substrate transferring unit 200 may be movable along the first direction D1 on the first guide unit 910 via an air bearing or a moving member.

The substrate transferring unit 200 may move the target substrate SUB in the first direction D1 with uniformly maintaining the floating height of the target substrate SUB. For example, the substrate transferring unit 200 may fix an edge portion of the target substrate SUB lifted up in the third direction D3 from the airflow stage 110. As a result, the floating height of the target substrate SUB lifted up in the third direction D3 from the airflow stage 110 may be uniformly maintained during the printing process. As the substrate transferring unit 200 moves in the first direction D1 on the first guide unit 910, the target substrate SUB may move in the first direction D1 in case that the target substrate SUB is fixed to the substrate transferring unit 200.

The electric field generating unit 300 may generate an electric field on the target substrate SUB during the printing process. The electric field generating unit 300 may move in the first direction D1 together with the target substrate SUB and the substrate transferring unit 200 and may generate an electric field on the target substrate SUB. The electric field generating unit 300 may move together with the target substrate SUB and the substrate transferring unit 200 with the moving direction and speed synchronized with the moving direction and speed of the target substrate SUB and the substrate transferring unit 200.

The electric field generating unit 300 may be disposed on the second guide unit 920. The electric field generating unit 300 may be disposed on the second guide unit 920 and may thus be movable in the first direction D1, but embodiments are not limited thereto. In another example, the electric field generating unit 300 may be movable along the first direction D1 on the second guide unit 920 via an air bearing or a moving member.

The alignment checking unit 400, the print head unit 500, and the ejection amount checking unit 600 of the inkjet printing apparatus 1000 may be sequentially arranged in the first direction D1. The alignment checking unit 400, the print head unit 500, and the ejection amount checking unit 600 may be spaced apart from one another in the first direction D1.

The alignment checking unit 400 may be disposed on the loading part LA of the stage unit 100. In case that the target substrate SUB is disposed on the loading part LA of the airflow stage 110, the alignment checking unit 400 may check the alignment of the target substrate SUB.

The alignment checking unit 400 may include an alignment support unit (e.g., 410 and 420) and a first sensing unit (e.g., CA1 and CA2). The alignment support unit (e.g., 410 and 420) may include first and second supports 410 and 420. The first sensing unit (e.g., CA1 and CA2) may include first alignment sensors CA1, which are mounted on the first support 410, and second alignment sensors CA2, which are mounted on the second support 420.

The first support 410 may include a first horizontal support 411, which extends in the horizontal direction, and first vertical supports 412, which are connected to end portions (e.g., opposite end portions) of the first horizontal support 411 and extend in the vertical direction, i.e., in the third direction D3. The direction in which the first horizontal support 411 extends may be the same as the direction of the short sides of the stage unit 100, i.e., the second direction D2.

The second support 420 may be spaced apart from the first support 410 in the first direction D1. The second support 420 may include a second horizontal support 421, which extends in the horizontal direction, and second vertical supports 422, which are connected to end portions (e.g., opposite end portions) of the second horizontal support 421 and extend in the vertical direction, i.e., in the third direction D3. The direction in which the second horizontal support 421 extends may be the same as the direction of the short sides of the stage unit 100, i.e., the second direction D2.

The first alignment sensors CA1 may be disposed above the loading part LA of the airflow stage 110. The first alignment sensors CA1 may be mounted on the first support 410. The first alignment sensors CA1 may be mounted on the first horizontal support 411 and may thus be a certain distance apart from the airflow stage 110 in the third direction D3.

The second alignment sensors CA2 may be disposed above the loading part LA of the airflow stage 110. The second alignment sensors CA2 may be mounted on the second support 420. The second alignment sensors CA2 may be mounted on the second horizontal support 421 and may thus be a certain distance apart from the airflow stage 110 in the third direction D3.

The distance between the first alignment sensors CA1, the second alignment sensors CA2, and the airflow stage 110 may be controlled within the range in which the first alignment sensors CA1 and the second alignment sensors CA2 are able to be a certain distance apart from the target substrate SUB and are able to thus ensure alignment-checking space in case that the target substrate SUB is disposed on the airflow stage 110.

The alignment checking unit 400 may include first alignment sensors CA1 and second alignment sensors CA2. Two first alignment sensors CA1 are illustrated as being mounted on the first support 410, and two second alignment sensors CA2 are illustrated as being mounted on the second support 420. However, the numbers of first alignment sensors CA1 and second alignment sensors CA2 are not limited thereto.

The first alignment sensors CA1 and the second alignment sensors CA2 may detect the position of the target substrate SUB on the airflow stage 110 and may align the target substrate SUB with a reference position. In an embodiment, the first alignment sensors CA1 and/or the second alignment sensors CA2 may include cameras. In a case where the first alignment sensors CA1 and/or the second alignment sensors CA2 include cameras, the first alignment sensors CA1 and/or the second alignment sensors CA2 may detect the position of the target substrate SUB by capturing an image of the target substrate SUB on the loading part LA of the airflow stage 110.

For example, the alignment checking unit 400 may further include a separate target substrate alignment mover for moving the target substrate SUB in the horizontal direction on the airflow stage 110, to align the target substrate SUB with the reference position.

The print head unit 500 may be disposed on the printing part PA of the stage unit 100. The print head unit 500 may print ink on the target substrate SUB moved in the first direction D1 from the loading part LA to the printing part PA of the airflow stage 110. The inkjet printing apparatus 1000 may further include an ink supply unit such as an ink cartridge, ink from the ink supply unit may be sprayed (or ejected) toward the target substrate SUB via the print head unit 500.

The print head unit 500 may include a third support 510 and a print head 520.

The third support 510 may include a third horizontal support 511, which extends in the horizontal direction, and third vertical supports 512, which are connected to end portions (e.g., opposite end portions) of the third horizontal support 511 and extend in the vertical direction, i.e., in the third direction D3. The direction in which the third horizontal support 311 extends may be the same as the direction of the short sides of the stage unit 100, i.e., the second direction D2.

The print head 520 may spray ink including dipoles onto the target substrate SUB. The print head 520 may be disposed above the printing part PA of the airflow stage 110.

The print head 520 may be mounted on the third horizontal support 511 of the third support 510. The print head 520 may be mounted on the third horizontal support 511 and may thus be a certain distance apart from the airflow stage 110 in the third direction D3. The print head 520 may be mounted on the third horizontal support 511, but may protrude in a direction from the third horizontal support 511. For example, the print head 520 may protrude from a second side in the first direction D2 (e.g., the lower side in a plan view) of the third horizontal support 511.

The ejection amount checking unit 600 may be disposed above the unloading part ULA of the stage unit 100. The ejection amount checking unit 600 may check the amount and the landing positions of droplets of ink sprayed by the print head unit 500. The ejection amount checking unit 600 may analyze ink applied to a test area of the target substrate SUB moved from the printing part PA to the unloading part ULA of the airflow stage 110 or ink applied to a separate test substrate. A process of spraying ink from the print head unit 500 onto the target substrate SUB will be described below.

The ejection amount checking unit 600 may include a fourth support 610 and a second sensing units 650.

The fourth support 610 may include a fourth horizontal support 611, which extends in the horizontal direction, and fourth vertical supports 612, which are connected to end portions (e.g., opposite end portions) of the fourth horizontal support 611 and extend in the vertical direction, i.e., in the third direction D3. The direction in which the fourth horizontal support 611 extends may be the same as the direction of the short sides of the stage unit 100, i.e., the second direction D2.

The second sensing units 650 may be disposed above the unloading part ULA of the airflow stage 110. The second sensing units 650 may be mounted on the fourth support 610 and may thus be a certain distance apart from the airflow stage 110 in the third direction D3. The second sensing units 650 may be movable in the second direction D2 on the fourth horizontal support 611 of the fourth support 610.

The distance between the second sensing units 650 and the airflow stage 110 may be controlled within the range in which the second sensing units 650 is able to be a certain distance apart from the target substrate SUB or the test substrate and is able to thus ensure processing (or checking) space in case that the target substrate SUB or the test substrate is disposed on the airflow stage 110.

The ejection amount checking unit 600 may include second sensing units 650. Three second sensing units 650 are illustrated as being provided, but embodiments are not limited thereto. The second sensing units 650 may be spaced apart from the airflow stage 110 and may detect ink applied on the target substrate SUB.

Figure 4:
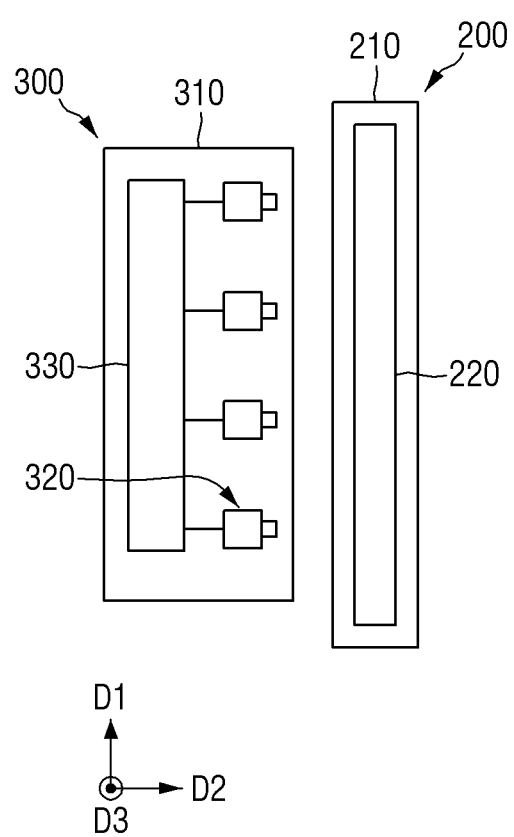
FIG. 4 is a schematic layout view illustrating the layout of a substrate transferring unit and the electric field generating unit according to an embodiment.
Figure 5:
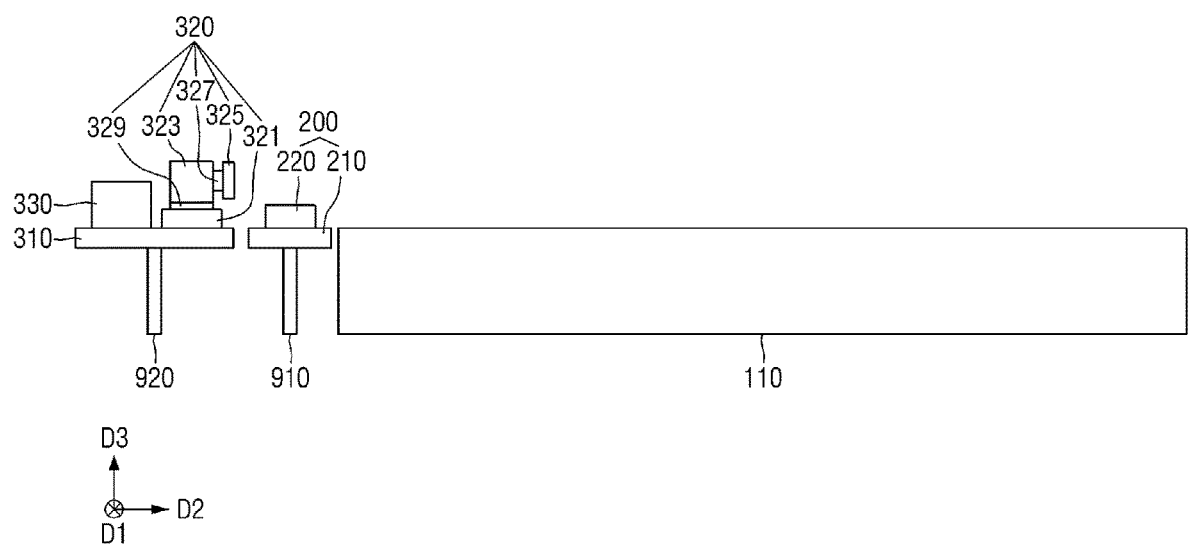
FIG. 5 is a schematic cross-sectional view illustrating the layout of the inkjet printing apparatus according to an embodiment.
Figure 6:
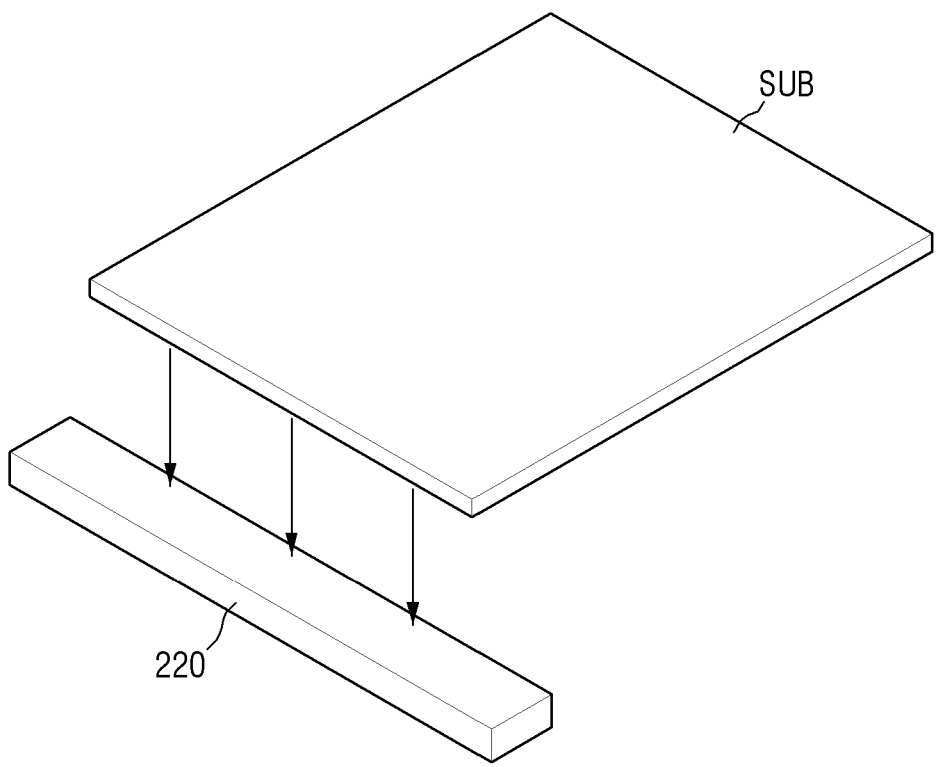
FIG. 6 is a schematic perspective view illustrating a gripper and a target substrate according to an embodiment.

FIG. 4 is a schematic layout view illustrating the layout of the substrate transferring unit and the electric field generating unit according to an embodiment. FIG. 5 is a schematic cross-sectional view illustrating the layout of the inkjet printing apparatus according to an embodiment. FIG. 6 is a schematic perspective view illustrating a gripper and the target substrate SUB according to an embodiment.

Referring to FIGS. 4 through 6, the substrate transferring unit 200 may be disposed on the outside of, and near, one long side of the airflow stage 110.

The substrate transferring unit 200 may include a first base substrate 210 and a gripper 220.

The first base substrate 210 may be disposed on the first guide unit 910. The first base substrate 210 may be movable in the first direction D1 on the first guide unit 910. The gripper 220 may be disposed on the first base substrate 210. In a case where the target substrate SUB is fixed to the gripper 220, the first base substrate 210 may move the target substrate SUB in the first direction D1 by moving on the first guide unit 910.

The first base substrate 210 may have a planar shape extending in the first direction D1.

The gripper 220 may be disposed on the first base substrate 210. The gripper 220 may be disposed on the first base substrate 210 and may extend in the first direction D1. In an embodiment, the gripper 220 may include an adsorption device. For example, the adsorption device may be a vacuum device, a vacuum chuck, or the like, but embodiments are not limited thereto.

The gripper 220 may fix the target substrate SUB with uniformly maintaining the floating height of the target substrate SUB. In an embodiment, in case that the target substrate SUB is disposed on the airflow stage 110 and is lifted up from the airflow stage 110 by spraying the air from the air holes AH formed on the surface of the airflow stage 110, the gripper 220 may generate negative pressure in the area of contact with the bottom surface (or lower surface) of an edge part of the target substrate SUB, and as a result, the edge part of the target substrate SUB may be adsorbed and fixed to the gripper 220. For example, the gripper 220 may fix the target substrate SUB on the top surface (or upper surface) thereof by generating negative pressure in the opposite direction to the third direction D3, from below the bottom surface (or lower surface) of the target substrate SUB. As the target substrate SUB is fixed to the gripper 220, the printing process may be performed with uniformly maintaining the floating height of the target substrate SUB from the airflow stage 110. As the target substrate SUB is fixed to the gripper 220 and the first base substrate 210 where the gripper 220 is disposed moves in the first direction D1, the target substrate SUB may be transferred in the first direction D1.

The electric field generating unit 300 may be disposed on the outside of, and near, a side of the substrate transferring unit 200. The electric field generating unit 300 may include a second base substrate 310, a probe unit 320, and a probe driving device 330.

The probe unit 320 may be disposed on the second base substrate 310. The second base substrate 310 may be disposed on the second guide unit 920. During the printing process, the second base substrate 310 may be movable in the first direction D1 on the second guide unit 920. The second base substrate 310 may be integral with the target substrate SUB by being synchronized with the target substrate SUB and the substrate transferring unit 200 and may thus be movable simultaneously with the target substrate SUB in the first direction D1.

The probe unit 320 may generate an electric field on the target substrate SUB lifted up from the airflow stage 110 and fixed to the gripper 220. The size and shape of the probe unit 320 may vary according to the shape of the target substrate SUB.

The probe unit 320 may extend in the first direction D1 and may include probes. The length by which the probe unit 320 extends in the extension direction of the probe unit 320 may cover the entire target substrate SUB. The probes of the probe unit 320 may be in contact with electrode pads of the target substrate SUB.

The probe driving device 330 may be disposed on the second base substrate 310, and outside the probe unit 320. The probe driving device 330 may be a device transmitting electrical signals to the probe unit 320. The probe driving device 330 may provide a voltage, for example, an alternating voltage, to the electrode pads of the target substrate SUB via the probe unit 320, which is in contact with the electrode pads of the target substrate SUB. Voltages may be applied at the same time or sequentially by the probe unit 320.

The probe unit 320 may include a probe support 321, a probe driver 323, a probe jig 325, a probe horizontal mover 327, and a probe vertical mover 329.

The probe support 321 may be disposed on the second base substrate 310.

The probe driver 323 may be disposed on the probe support 321. The probe driver 323 may drive the probe horizontal mover 327 and the probe vertical mover 329 such that the probe jig 325 may move in the horizontal and vertical directions, for example, in the second and third directions D2 and D3, and may thus be disposed on the electrode pads of the target substrate SUB.

As the probe horizontal mover 327 and the probe vertical mover 329 are driven by the probe driver 323, the probe jig 325 may be connected to (or disconnected from) the electrode pads of the target substrate SUB. The probe horizontal mover 327 may drive the probe jig 325 to move in the horizontal direction, for example, in the second direction D2. The probe vertical mover 329 may drive the probe jig 325 to move in the vertical direction, for example, in the third direction D3. The probe driver 323 may drive the probe jig 325 to be connected to the target substrate SUB in the step of generating an electric field on the target substrate SUB, for example, during or before the printing process, during the operation of the inkjet printing apparatus 1000 and may drive the probe jig 325 to be disconnected from the target substrate SUB in other steps of the operation of the inkjet printing apparatus 1000.

The probe jig 325 may generate an electric field on the target substrate SUB via electrical signals transmitted from the probe driving device 330. The probe jig 325 may be connected to the target substrate SUB to transmit the electrical signals to the target substrate SUB and thus to generate an electric field on the target substrate SUB. For example, the probe jig 325 may be in contact with the electrode pads or power pads of the target substrate SUB, and the electrical signals transmitted from the probe driving device 330 may be delivered to the electrode pads or the power pads. The electric signals transmitted to the target substrate SUB may generate an electric field on the target substrate SUB. For example, the probe jig 325 may be in contact with the top surface (or upper surface) of the target substrate SUB to help the gripper 220 of the substrate transferring unit 200 fix the target substrate SUB. As the probe jig 325 presses the top surface (or upper surface) of the target substrate SUB lifted up from the airflow stage 110 in the opposite direction to the third direction D3, the target substrate SUB may be fixed to the probe jig 325 and the gripper 220.

The probe unit 320 is not limited thereto. The structure and the layout of the probe unit 320 are not limited as long as the probe unit 320 generates an electric field on the target substrate SUB on the airflow stage 110.

Figure 7:
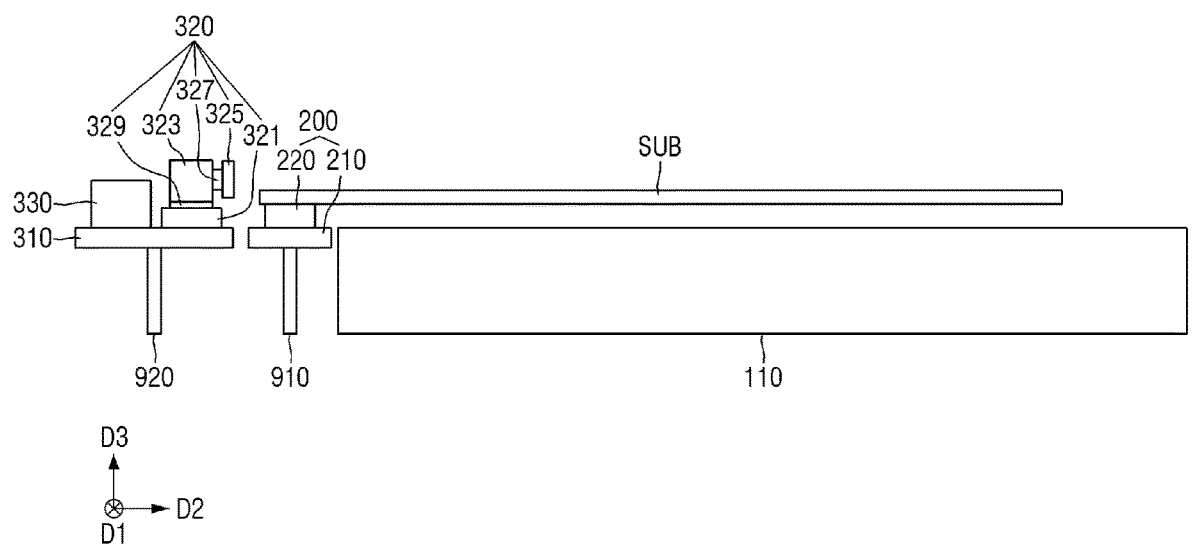
FIGS. 7 and 8 are schematic views illustrating the states of a probe unit according to an embodiment.
Figure 8:
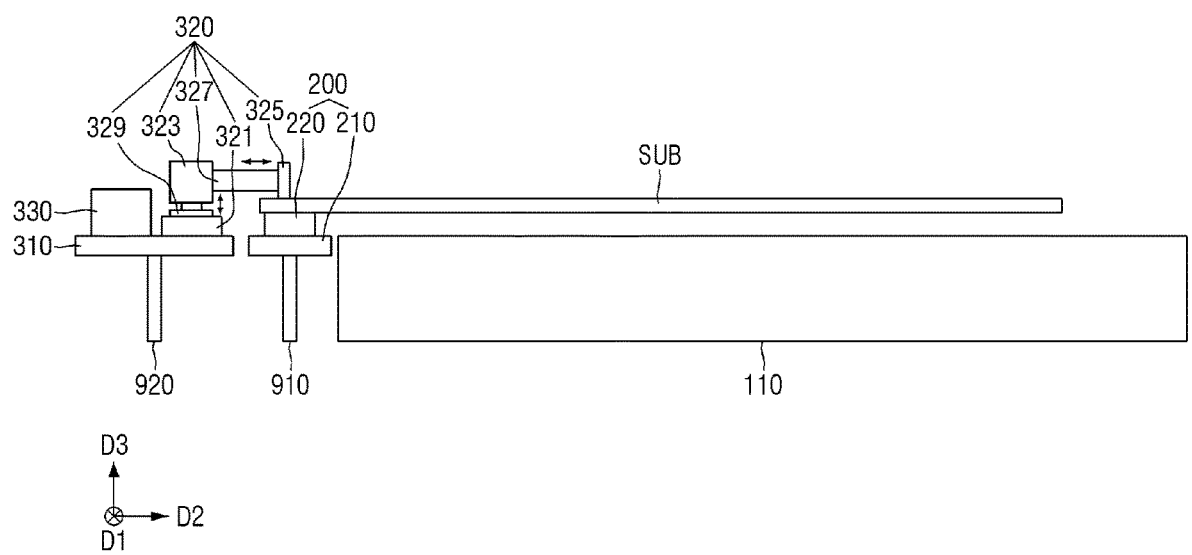

FIGS. 7 and 8 are schematic views illustrating the states of the probe unit according to an embodiment.

As mentioned above, the probe driver 323 of the probe unit 320 may operate in accordance with the steps of the operation of the inkjet printing apparatus 1000.

Referring to FIGS. 7 and 8, as the target substrate SUB is disposed on the airflow stage 110 and is lifted up by spraying the air to the bottom surface (or lower surface) of the target substrate SUB through the air holes AH formed on the top surface (or upper surface) of the airflow stage 110, an edge part of the target substrate SUB may be fixed by the gripper 220 of the substrate transferring unit 200. In case that the target substrate SUB is yet to be fixed on the gripper 220 or yet to be lifted up, the probe jig 325 may be disposed on the probe support 321 to be spaced apart from the target substrate SUB and the gripper 220. The probe driver 323 of the probe unit 320 may drive the probe jig 325 in the second and third directions D2 and D3, which are the horizontal and vertical directions, respectively, not to overlap the target substrate SUB and/or the gripper 220.

In a second state of forming an electric field on the target substrate SUB by preparing the target substrate SUB on the airflow stage 110 and fixing the target substrate SUB to the gripper 220 with the gripper 220 disposed on the bottom surface (or lower surface) of an edge part of the target substrate SUB, the probe driver 323 of the probe unit 320 may drive the probe jig 325 to be connected to the target substrate SUB. The probe driver 323 may drive the probe vertical mover 329 in the vertical direction, i.e., in the third direction D3, and drive the probe horizontal mover 327 in the horizontal direction, i.e., in the second direction D2, to place the probe jig 325 in contact with the electrode pads formed on the top surface (or upper surface) of the target substrate SUB. Electrical signals may be transmitted to the target substrate SUB via the probe jig 325 of the probe unit 320, and as a result, an electric field may be generated on the target substrate SUB.

Figure 9:
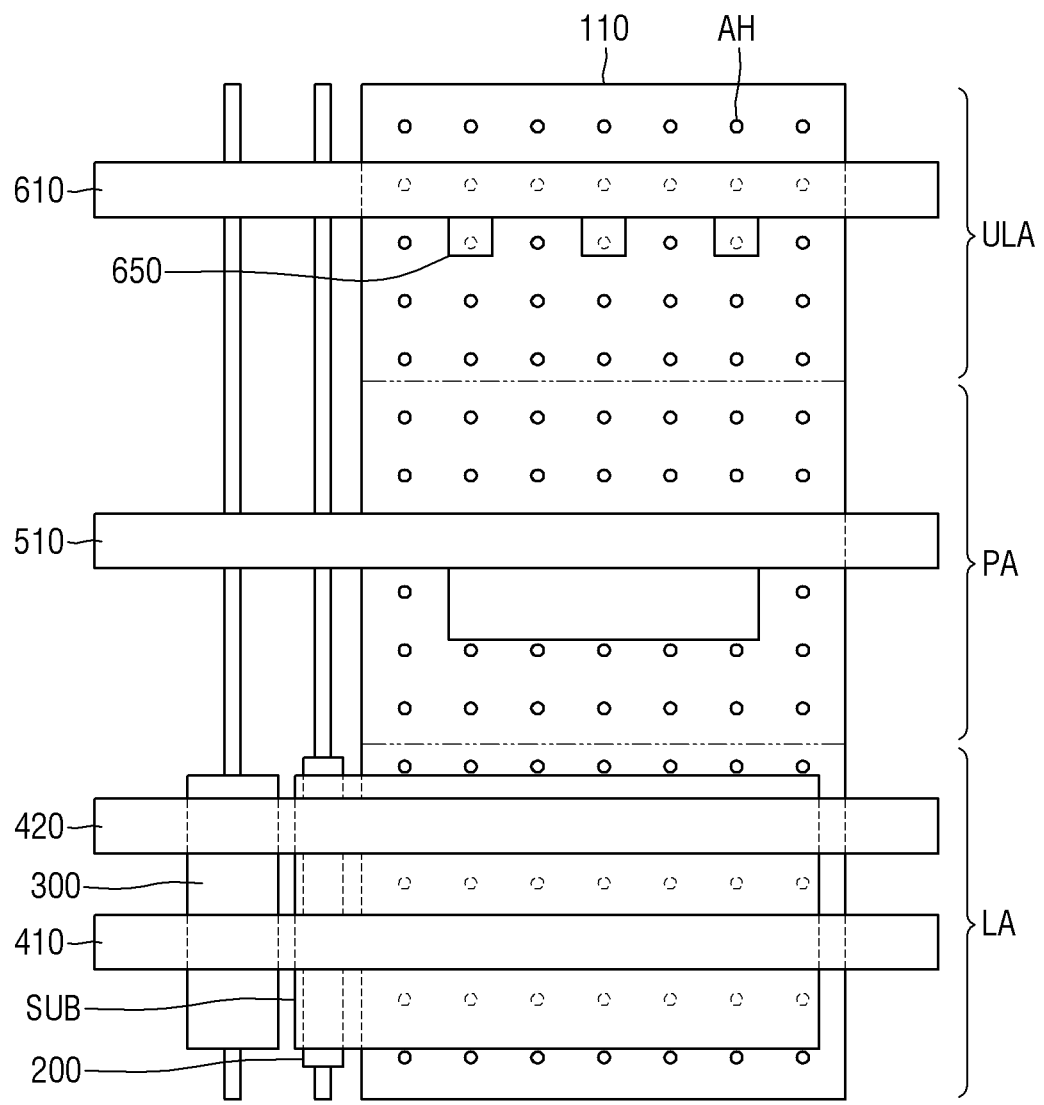
FIG. 9 is a schematic plan view illustrating the step of loading a target substrate in a loading part, according to an embodiment.
Figure 10:
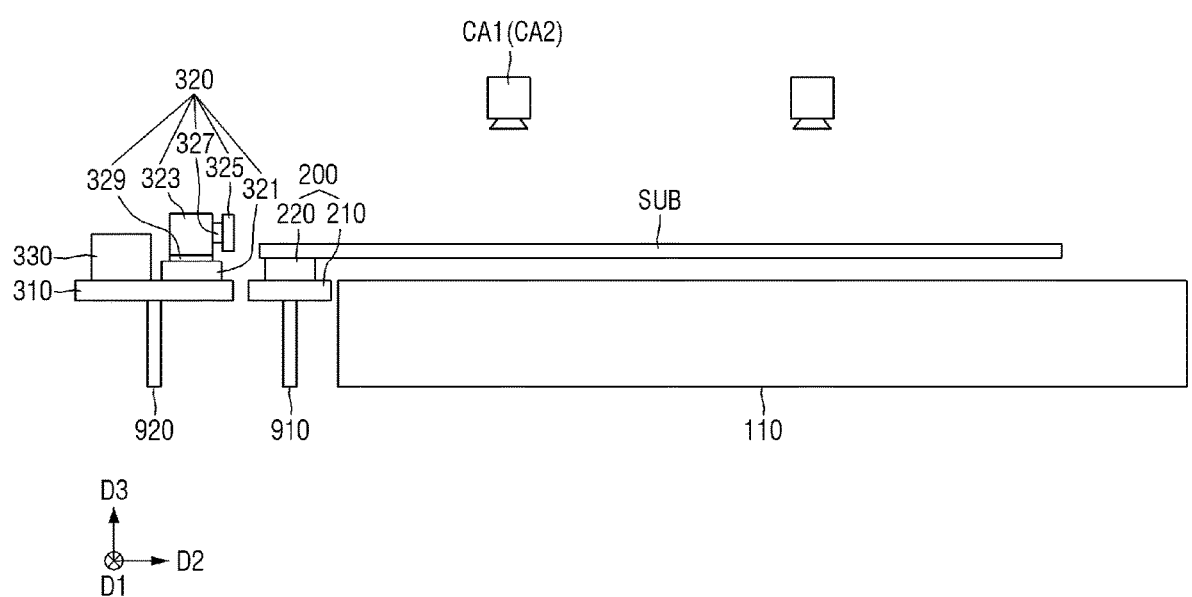
FIGS. 10 and 11 are schematic cross-sectional views an example of FIG. 9.
Figure 11:
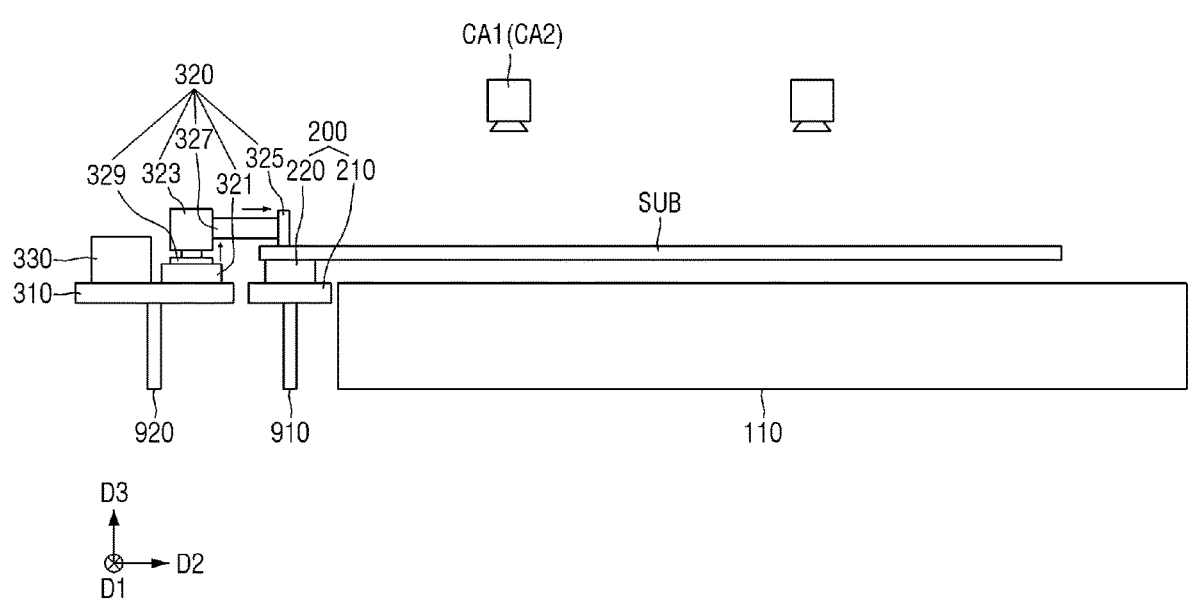

FIG. 9 is a schematic plan view illustrating the step of loading a target substrate SUB in a loading part, according to an embodiment. FIGS. 10 and 11 are schematic cross-sectional views an example of FIG. 9.

Referring to FIGS. 9 through 11, the target substrate SUB may be disposed on the loading part LA of the airflow stage 110. As the air is sprayed onto the target substrate SUB on the loading part LA of the airflow stage 110, through the air holes AH formed on the top surface (or upper surface) of the airflow stage 110, the target substrate SUB may be fixed to the gripper 220. The bottom surface (or lower surface) of the target substrate SUB may be in contact with the top surface (or upper surface) of the gripper 220.

Referring to FIG. 10, the first sensing unit (e.g., CA1 and CA2) may be disposed above the target substrate SUB, which is fixed to the gripper 220, and may capture an image of the target substrate SUB. The first sensing unit (e.g., CA1 and CA2) may check whether the target substrate SUB is disposed at the reference position by capturing an image of the target substrate SUB and detecting the position of the target substrate SUB. For example, the target substrate SUB may be aligned with the reference position by moving the target substrate SUB in the horizontal direction via a separate moving member in case that the position of the target substrate SUB, detected by the first sensing unit (e.g., CA1 and CA2), differs from the reference position.

Thereafter, in case that the target substrate SUB is aligned with the reference position, the probe unit 320 of the electric field generating unit 300 may be in contact with (or electrically connected to) the electrode pads on the top surface (or upper surface) of the target substrate SUB.

For example, referring to FIG. 11, the probe driver 323 of the probe unit 320 may drive the probe horizontal mover 327 and the probe vertical mover 329 and may thus move the probe jig 325 to be positioned on the electrode pads of the target substrate SUB. The probe jig 325 may be disposed in contact with the top surface (or upper surface) of the target substrate SUB by the probe driver 323. In an embodiment, the probe jig 325 may be in contact with the top surface (or upper surface) of an edge part of the target substrate SUB, and the gripper 220 may be in contact with the bottom surface (or lower surface) of the edge part of the target substrate SUB. The target substrate SUB may be fixed such that the floating height of the target substrate SUB from the airflow stage 110 may be uniformly maintained by the probe jig 325 and the gripper 220.

Figure 12:
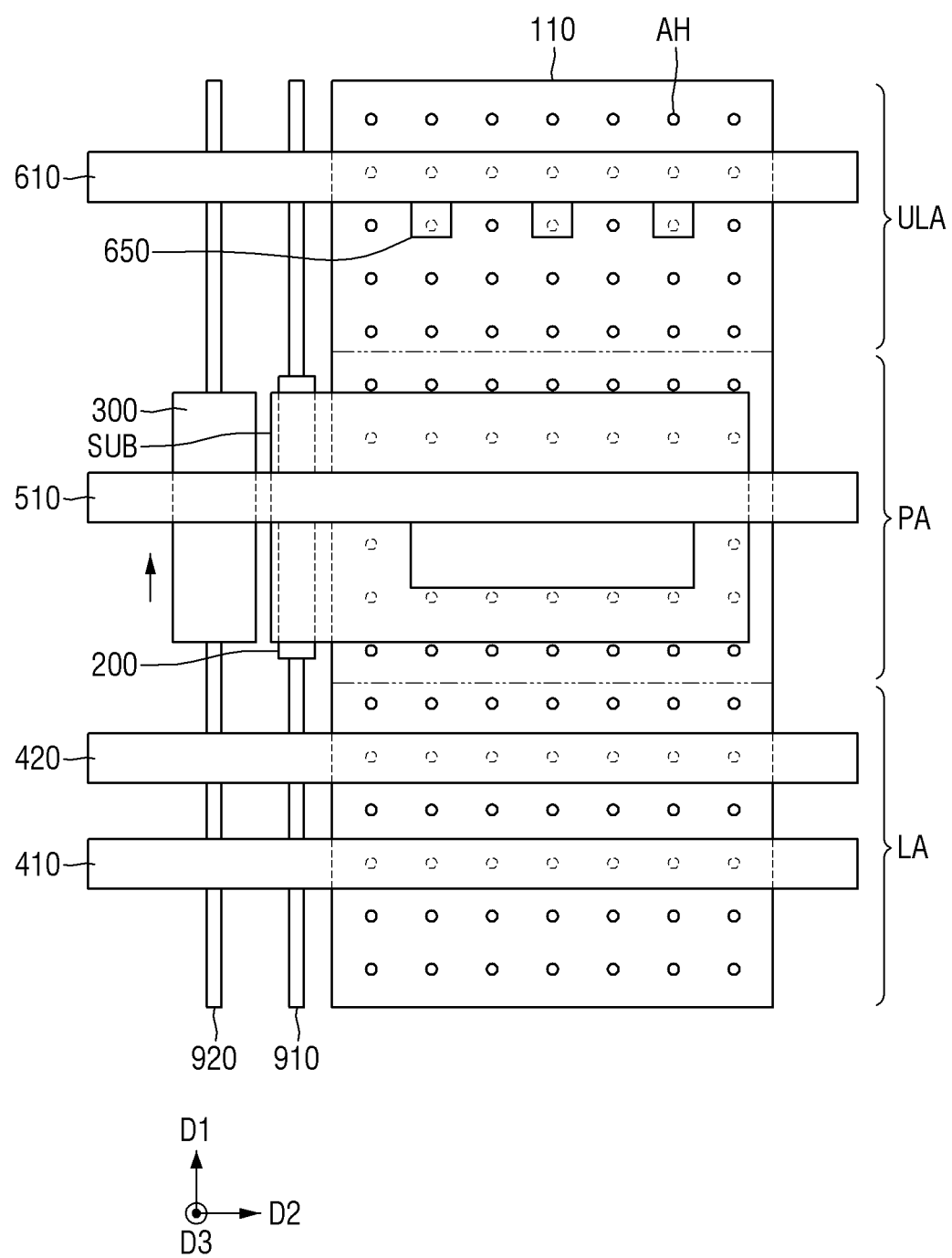
FIG. 12 is a schematic plan view illustrating the step of placing the target substrate in a printing part, according to an embodiment.
Figure 13:
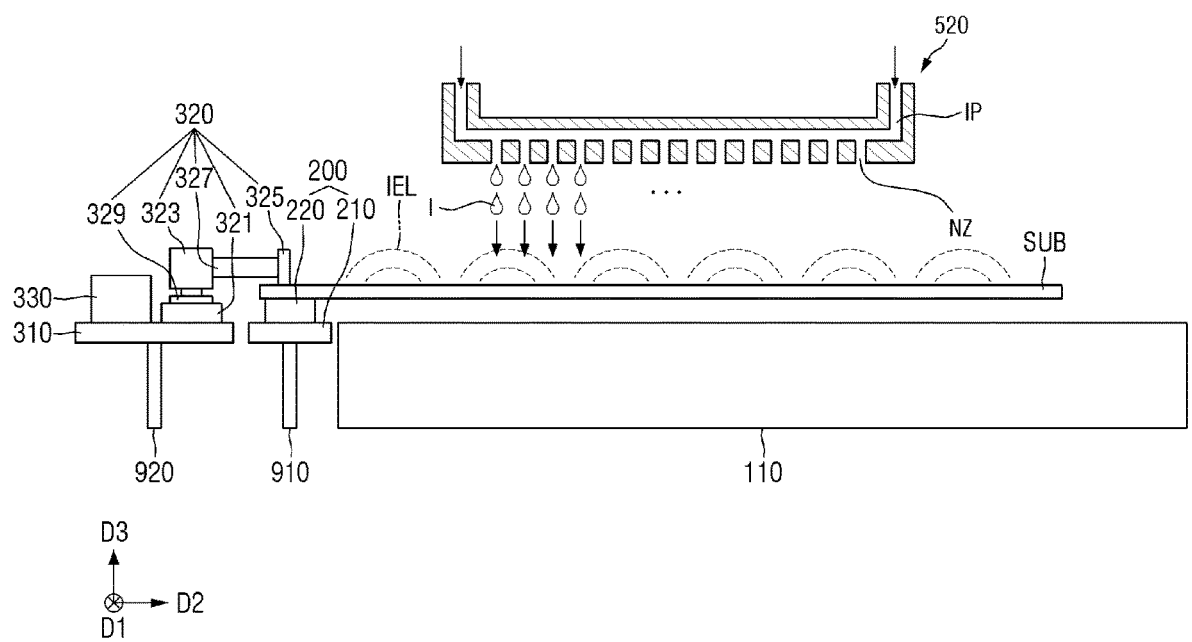
FIG. 13 is a schematic cross-sectional view illustrating an example of FIG. 12.
Figure 14:
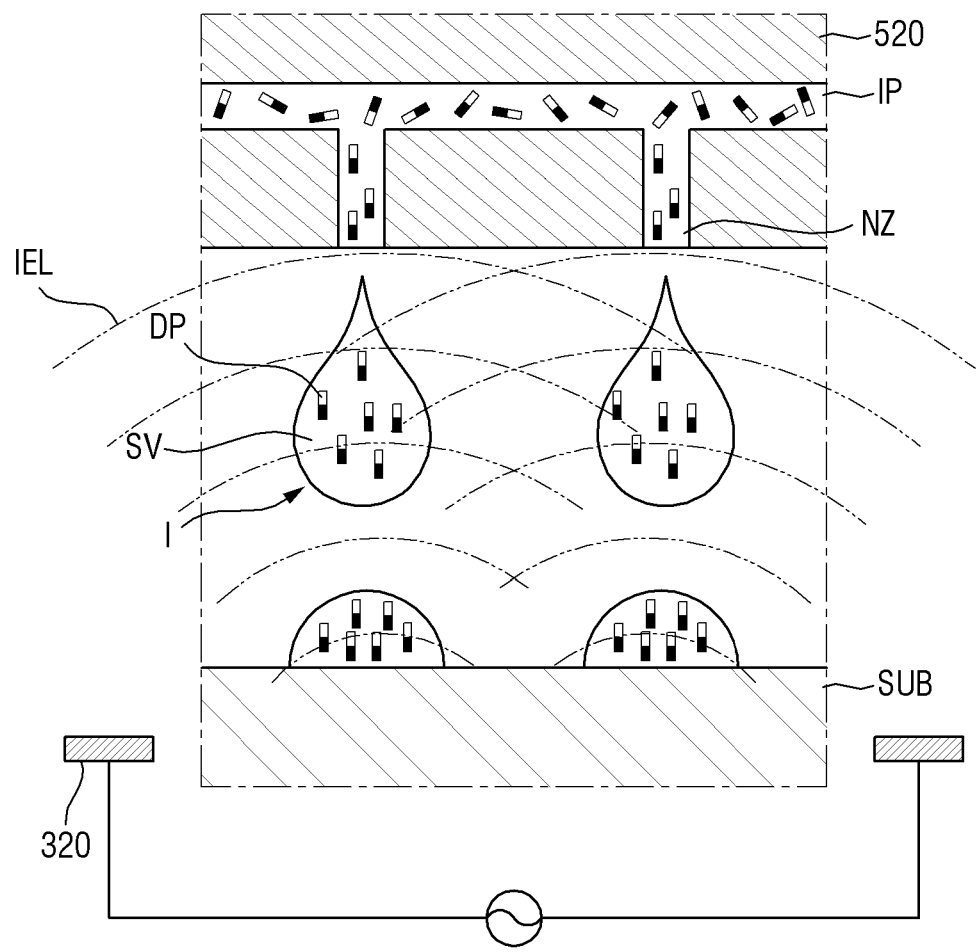
FIG. 14 is a schematic view illustrating how an electric field is generated on the target substrate by the probe unit, according to an embodiment.

FIG. 12 is a schematic plan view illustrating the step of placing the target substrate SUB in the printing part, according to an embodiment. FIG. 13 is a schematic cross-sectional view illustrating an example of FIG. 12. FIG. 14 is a schematic view illustrating how an electric field is generated on the target substrate by the probe unit, according to an embodiment.

Referring to FIGS. 12 through 14, after the alignment of the target substrate SUB on the airflow stage 110 is complete, the target substrate SUB may be moved along the first and second guide units 910 and 920 in the first direction D1, together with the substrate transferring unit 200 and the electric field generating unit 300. For example, as the bottom surface (or lower surface) of the edge part of the target substrate SUB is fixed to the gripper 220 and the electrode pads on the top surface (or upper surface) of the edge part of the target substrate SUB are in contact with the probe jig 325, the target substrate SUB may be movable in the first direction D1 together with the substrate transferring unit 200 and the electric field generating unit 300. The target substrate SUB may be lifted up from above the airflow stage 110 and may be transferred from the loading part LA to the printing part PA by the substrate transferring unit 200.

Ink I may be sprayed onto the target substrate SUB, lifted up from the airflow stage 110 and transferred in the first direction D1 to the printing part PA, via the print head 520. The direction in which the print head 520 extends may be the same as the direction in which the third horizontal support 511 of the third support 510 extends. For example, the direction in which the print head 520 extends may be the direction of the short sides of the airflow stage 110, i.e., the second direction D2.

The print head 520 may include nozzles NZ, from which the ink I is ejected. The print head 520 may include an inner tube IP, and the inner tube IP may be formed in the direction in which the print head 520 extends and may deliver the ink I. The nozzles NZ may be arranged along the direction in which the print head 520 extends. The nozzles NZ may be arranged in one or more rows.

Each of the nozzles NZ may be connected to the inner tube IP of the print head 520. The ink I may be supplied into the inner tube IP of the print head 520, may flow along the inner tube IP, and may be sprayed through the nozzles NZ. The ink I sprayed through the nozzles NZ may be supplied to the top surface (or upper surface) of the target substrate SUB. The amount of ink I sprayed through the nozzles NZ may be controlled by a voltage applied to the nozzles NZ. In an embodiment, the amount of the ejected ink of each of the nozzles NZ may be about 1 pl to about 50 pl, but embodiments are not limited thereto.

A single print head 520 is illustrated as being provided, but embodiments are not limited thereto. For example, for a process that provides multiple types of inks I to the target substrate SUB, the number of print heads 520 corresponding to the number of types of inks I may be provided.

Referring to FIG. 14, the ink I may be provided as a solution. The ink I may include, for example, a solvent SV and dipoles DP dispersed in the solvent SV. The solvent SV may be acetone, water, alcohol, toluene, or the like. The solvent SV may be a material that is vaporized or volatilized by room temperature or heat. The dipoles DP may be dispersed in the solvent SV. The dipoles DP may be solid materials that finally remain on the target substrate SUB after the removal of the solvent SV.

The dipoles DP may be objects having an end portion of a first polarity and another end portion of a second polarity, which is different from the first polarity. For example, an end portion of each of the dipoles DP may have a positive polarity, and another end portion of each of the dipole DP may have a negative polarity. In case that the dipoles DP having different polarities at end portions (e.g., opposite end portions) thereof are disposed in an electric field IEL generated on the target substrate SUB by the probe unit 320 of the electric field generating unit 300, the orientation direction of the dipoles DP may be controlled by electrical forces (i.e., an attractive force and a repulse force).

The dipoles DP may extend in a direction. The dipoles DP may be light-emitting diodes such as, for example, inorganic light-emitting diodes having a size of several micrometers or nanometers and formed of an inorganic material. The dipoles DP included in the ink I may include semiconductor layers doped with impurities of an arbitrary conductivity type (e.g., a p type dopant or an n type dopant). The semiconductor layers may receive electrical signals from an external power source and may thus emit light of a certain wavelength band.

In the case of spraying the ink I, including the dipoles DP, onto the target substrate SUB via the print head 520, in case that the electric field IEL is generated on the target substrate SUB, the dipoles DP having the first and second polarities may continue to receive electrical forces until the ink I is supplied from the nozzles NZ onto the target substrate SUB. Due to the electrical forces, the dipoles DP may be oriented, for example, in the direction of the electric field IEL.

FIG. 14 illustrates that the probe unit 320 generates the electric field IEL in case that the ink I is sprayed through the nozzles NZ. As a result, the dipoles DP may continue to receive forces from the electric field IEL until the dipoles DP arrive at (or contact on) the target substrate SUB after being ejected from the nozzles NZ, but embodiments are not limited thereto. In another example, the probe unit 320 may generate the electric field IEL after the spraying of the ink onto the target substrate SUB. For example, the dipoles DP may be sprayed onto the target substrate SUB in random orientation directions and may be arranged in a direction, inside the sprayed ink I, by the electric field IEL.

The probe unit 320 is illustrated as generating the electric field IEL on the target substrate SUB in case that the ink I is being sprayed onto the target substrate SUB, but embodiments are not limited thereto. In another example, the probe unit 320 may generate the electric field IEL on the target substrate SUB in case that the target substrate SUB is being transferred to the unloading part ULA after the spraying of the ink I.

Figure 15:
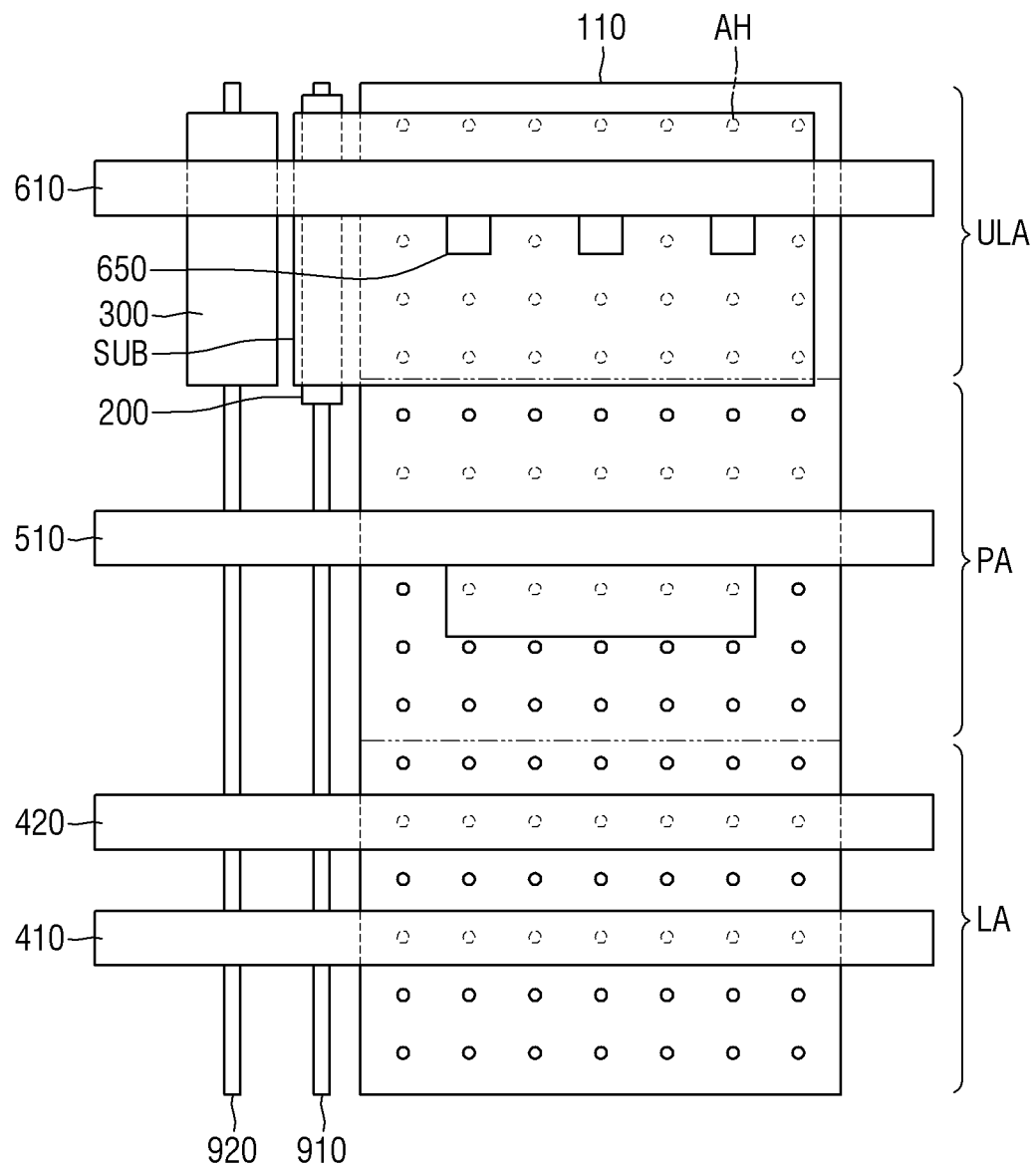
FIG. 15 is a schematic plan view illustrating the step of placing the target substrate in an unloading part, according to an embodiment.
Figure 16:
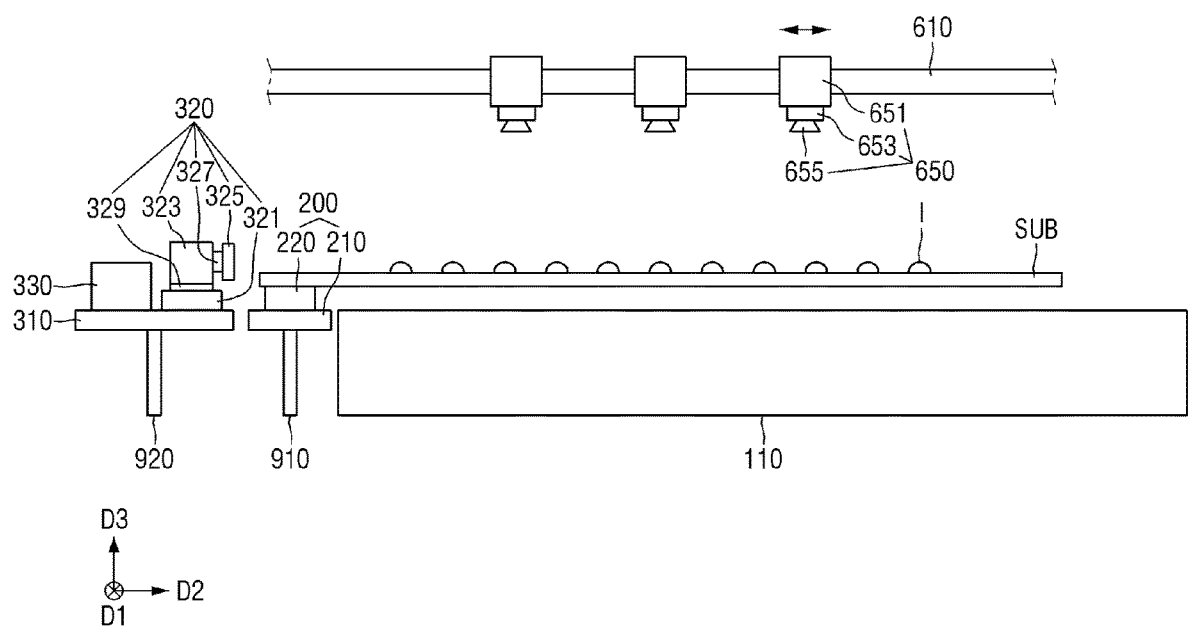
FIG. 16 is a schematic cross-sectional view of an example of FIG. 15.
Figure 17:
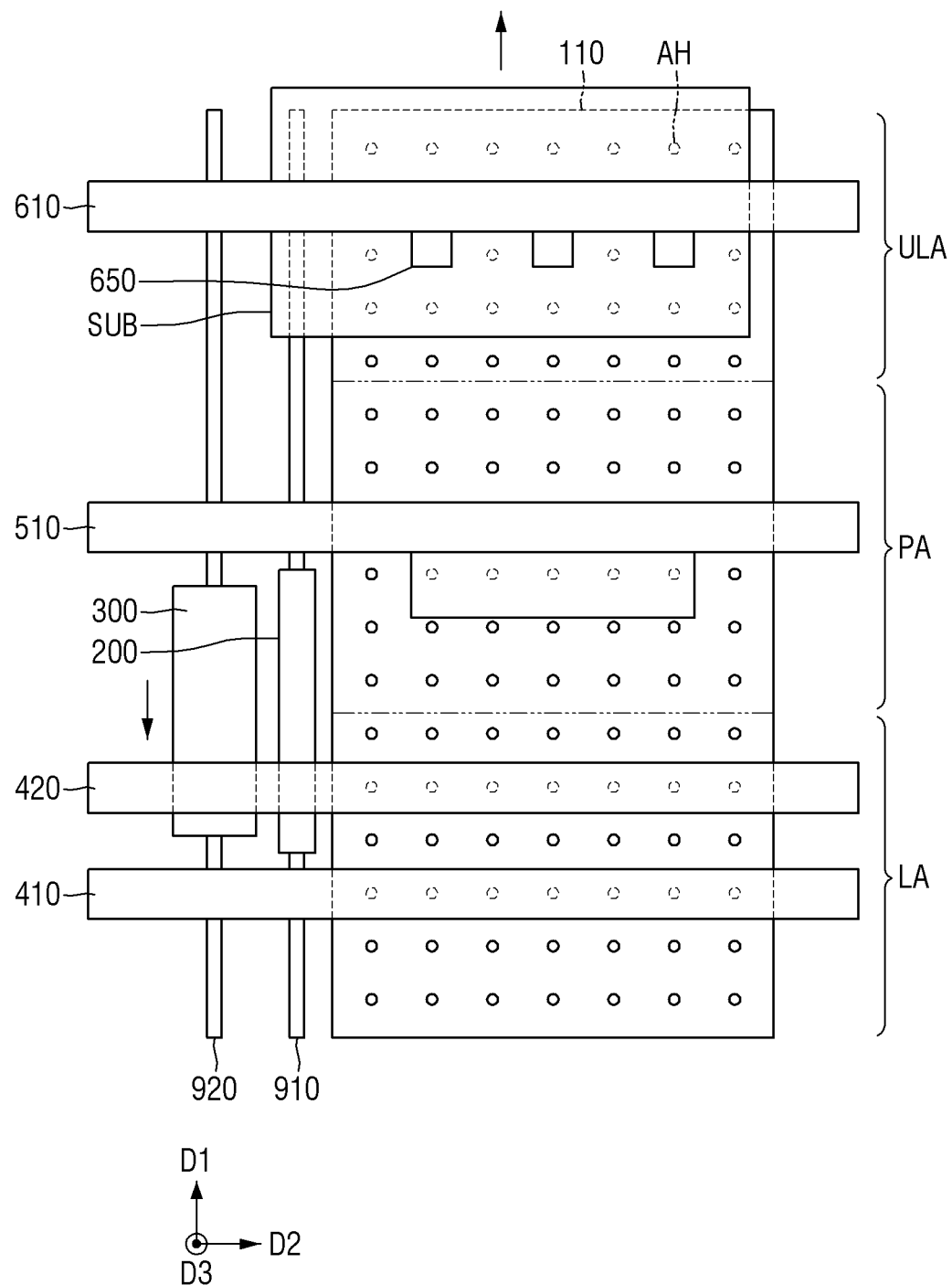
FIG. 17 is a schematic plan view illustrating the step of discharging the target substrate.

FIG. 15 is a schematic plan view illustrating the step of placing the target substrate SUB in the unloading part, according to an embodiment. FIG. 16 is a schematic cross-sectional view of an example of FIG. 15. FIG. 17 is a schematic plan view illustrating the step of discharging the target substrate.

Referring to FIGS. 15 and 16, after the application of the ink I onto the target substrate SUB via the print head unit 500 is complete, the target substrate SUB may be moved in the first direction D1 along the first and second guide units 910 and 920, together with the substrate transferring unit 200 and the electric field generating unit 300 and may thus be transferred to the unloading part ULA. In the unloading part ULA, the ink I sprayed to the test area of the target substrate SUB may be checked via the second sensing units 650. For example, the second sensing units 650 may detect the diameter and the position of the ink I sprayed onto the target substrate SUB and may measure error in the diameter and the position of the ink I. Data regarding the ink I sensed by the second sensing units 650 may be fed back to control settings of the inkjet printing apparatus 1000.

The second sensing units 650 may be connected to the fourth support 610 and may include first movers 651, which are movable in the horizontal direction, first supports 653, which are disposed on the surfaces of the first movers 651, and first sensors 655, which are disposed on the first support 653.

The first movers 651 may be mounted on the fourth horizontal support 611 of the fourth support 610 and may be movable in the second direction D2, which is the direction in which the fourth horizontal support 611 extends. As the first movers 651 move in the second direction D2, the first supports 653 mounted on the first movers 651 may move in the second direction D2.

The first supports 653 may be mounted on the first movers 651. The first supports 653 may be disposed at the bottom surfaces (or lower surfaces) of the first movers 651 and may extend in the first direction D1. First end portions of the first supports 653 may be connected to the first movers 651, and second end portions of the first supports 653 may be connected to the first sensors 655. For example, the first end portions and the second end portions of the first supports 653 may be opposite to each other.

The first sensors 655 may be disposed above the airflow stage 110. The first sensors 655 may be mounted on the first supports 653 to be a certain distance apart from the airflow stage 110. The first sensors 655 may be disposed above the airflow stage 110 to detect a material applied to the test area of the target substrate SUB lifted up from the airflow stage 110 or to the test substrate. The material applied to the test area of the target substrate SUB may include the ink I, which includes the solvent SV and the dipoles DP dispersed in the solvent SV. As the first movers 651 move in the second direction D2, the first sensors 655 may detect (or capture an image of) the material applied on each area of the target substrate SUB.

In an embodiment, the first sensors 655 may be high-resolution cameras. In a case where the first sensors 655 are high-resolution cameras, the first sensors 655 may be disposed above the target substrate SUB with the ink I applied thereon and may capture an image of the test area of the target substrate SUB to measure the diameter and the position of the material applied on the target substrate SUB and error in the diameter and the position of the material applied on the target substrate SUB. However, the first sensors 655 are not limited to high-resolution cameras as long as they detect the material applied on the target substrate SUB.

Error may be measured by comparing the diameter and the applied position of the ink I, measured by the second sensing units 650, with a reference set value. For example, the measured error may be compared with a threshold value, and the amount of the ink I sprayed by the print head 520 and the position of an ink ejection member of the print head 520 may be adjusted based on the results of the comparison to be close to the reference set value.

Referring to FIG. 16, in a process of placing the target substrate SUB in the unloading part ULA and checking the amount of the ejected ink I, the probe unit 320 of the electric field generating unit 300 may be spaced apart from the target substrate SUB. In a case where the target substrate SUB is disposed in the unloading part ULA, the probe driver 323 of the probe unit 320 may drive the probe horizontal mover 327 and the probe vertical mover 329 to space the probe jig 325 apart from the top surface (or upper surface) of the target substrate SUB. Thus, electric field may not be generated on the target substrate SUB. However, embodiments are not limited thereto. In another example, the probe driving device 330 may be driven not to provide electrical signals to the probe unit 320, and the probe jig 325 may be maintained to be in contact with the top surface (or upper surface) of the target substrate SUB.

Thereafter, referring to FIG. 17, in case that the printing process of applying the ink I onto the target substrate SUB and the process of checking the amount of the ejected ink from the print head 520 are complete, the target substrate SUB may move along the first direction D1 and may thus be discharged from the inkjet printing apparatus 1000. As the target substrate SUB is discharged along the first direction D1, the substrate transferring unit 200 and the electric field generating unit 300 may move in the opposite direction to the first direction D1, i.e., in a downward direction, and may thus be disposed on a side of the loading part LA of the airflow stage 110.

Other embodiments will hereinafter be described, focusing on the differences with the embodiment, and descriptions of elements or features that have been described above in connection with the embodiment will be omitted or simplified for descriptive convenience.

Figure 18:
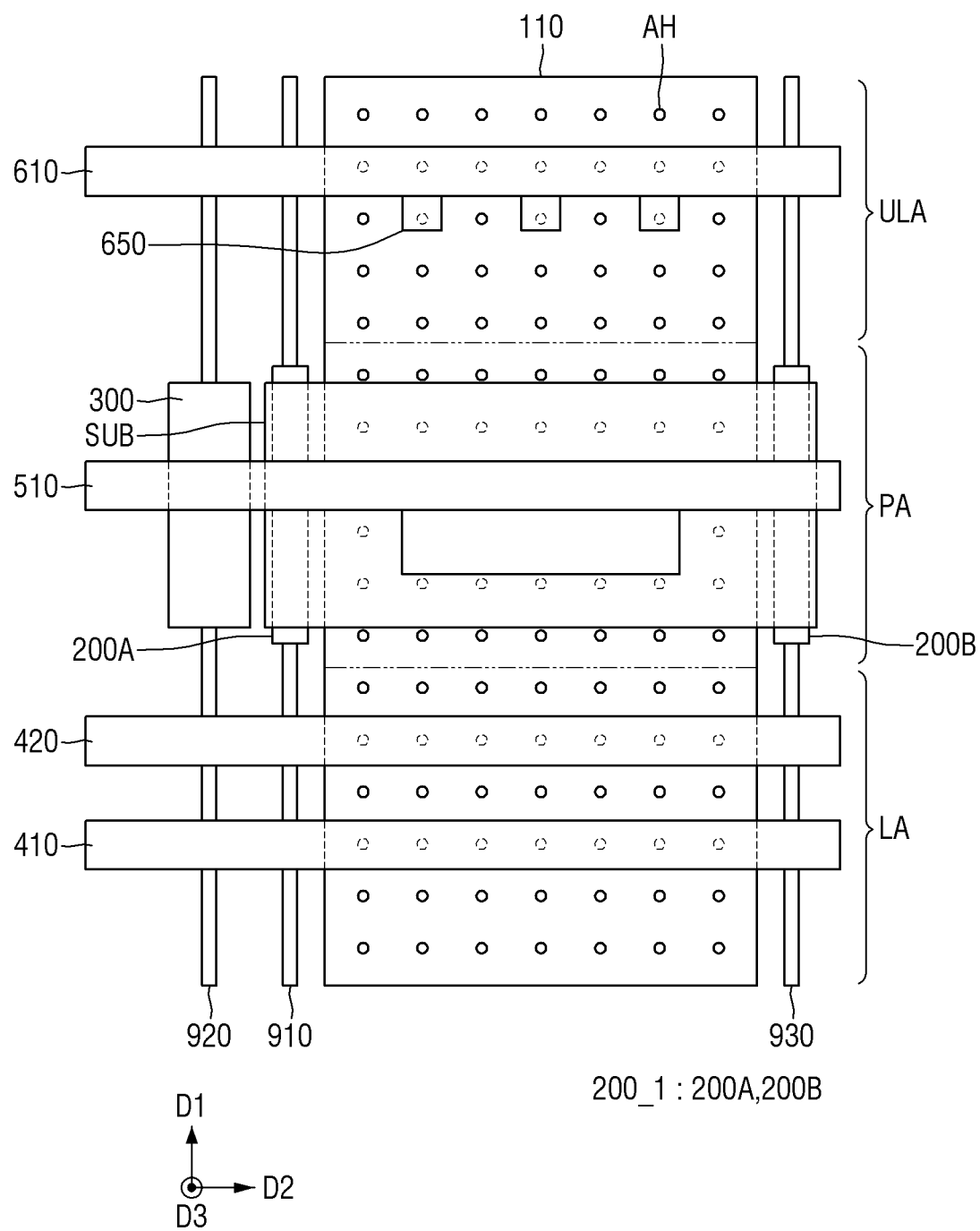
FIG. 18 is a schematic plan view of an inkjet printing apparatus according to an embodiment.
Figure 19:
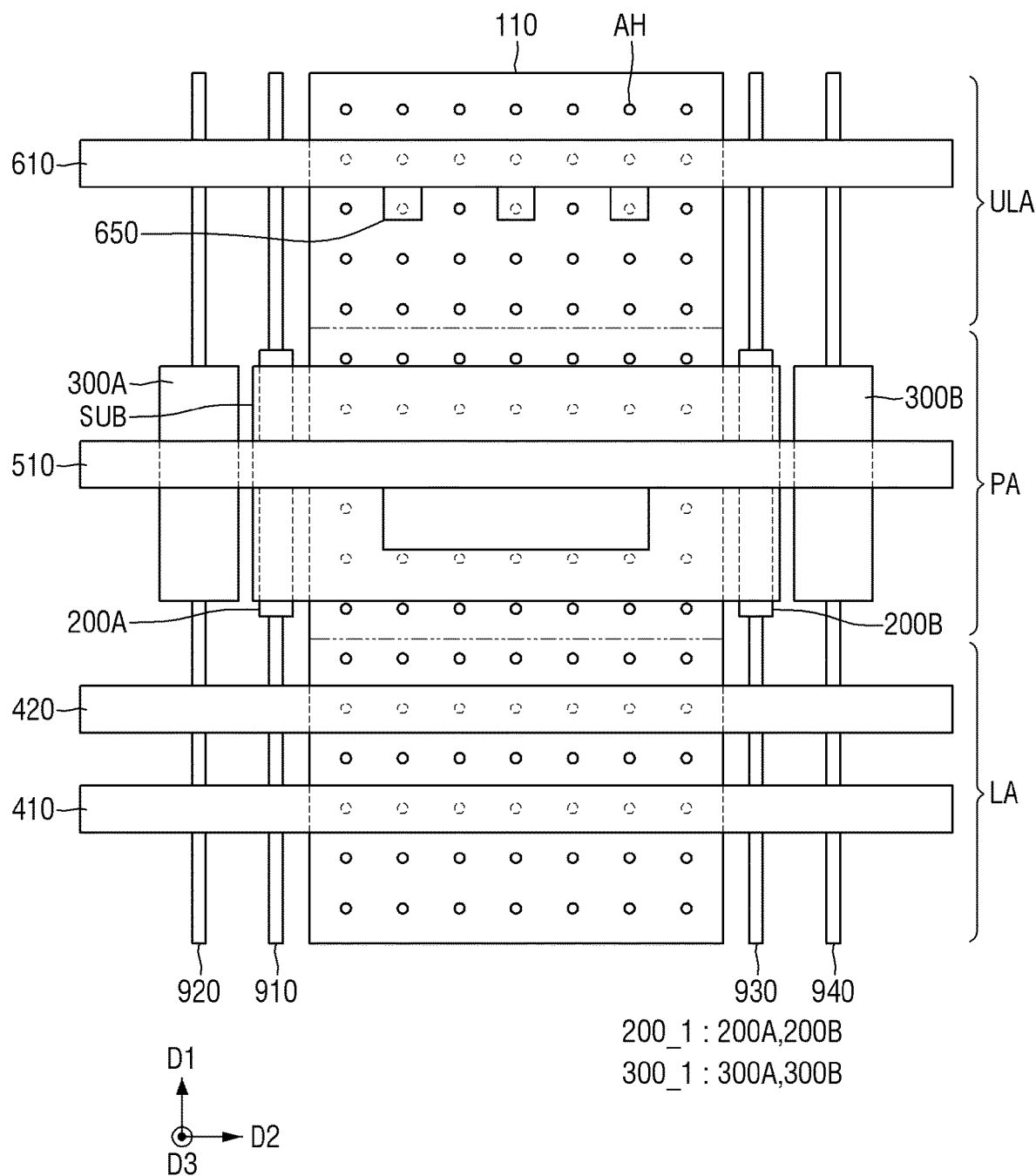
FIG. 19 is a schematic plan view of an inkjet printing apparatus according to an embodiment.
Figure 20:
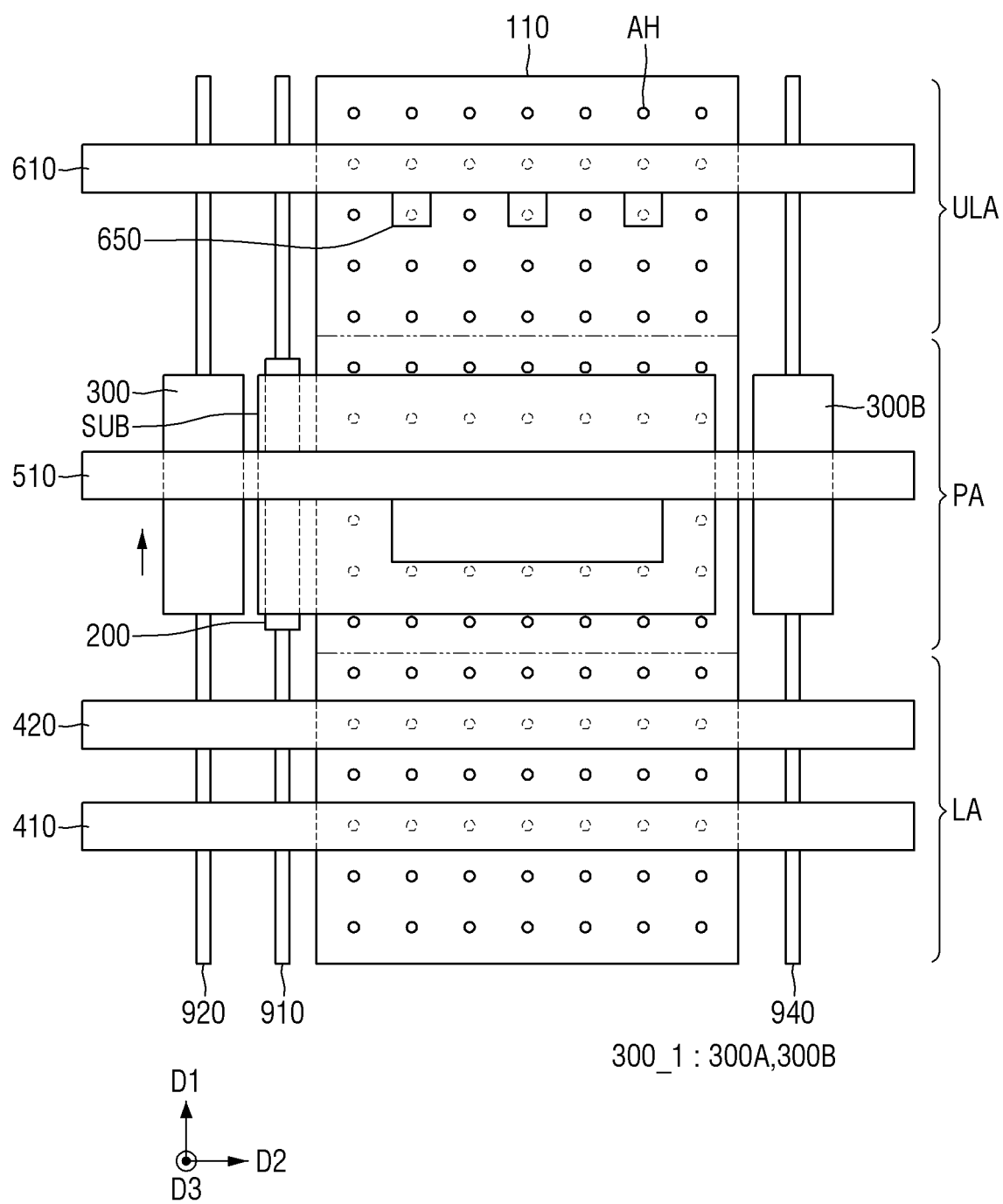
FIG. 20 is a schematic plan view of an inkjet printing apparatus according to an embodiment.

FIG. 18 is a schematic plan view of an inkjet printing apparatus according to an embodiment. FIG. 19 is a schematic plan view of an inkjet printing apparatus according to an embodiment. FIG. 20 is a schematic plan view of an inkjet printing apparatus according to an embodiment. FIGS. 18 through 20 illustrate various inkjet printing apparatuses having different numbers and/or layouts of substrate transferring units and/or different numbers and/or layouts of electric field generating units.

The inkjet printing apparatus of FIG. 18 differs from the inkjet printing apparatus of FIG. 3 in that a substrate transferring unit is disposed on sides (e.g., opposite sides) of a stage unit.

Referring to FIG. 18, a substrate transferring unit 200_1 may include first and second substrate transferrers 200A and 200B. The first substrate transferrers 200A may have substantially the same configuration, structure, and layout as the substrate transferring unit 200 of FIG. 3. The second substrate transferrer 200B may have the same configuration and structure as the substrate transferring unit 200. Descriptions of the configuration and structure of the first and second substrate transferrers 200A and 200B may be replaced with the description of the substrate transferring unit 200, and the layout of the first and second substrate transferrers 200A and 200B relative to an airflow stage 110 will hereinafter be described.

An inkjet printing apparatus 1000 may further include a third guide unit 930 on the right side of the airflow stage 110. The third guide unit 930 may extend in the direction in which the airflow stage 110 extends, i.e., in a first direction D1.

The substrate transferring unit 200_1 may be disposed on sides (e.g., opposite sides) of the airflow stage 110.

The first substrate transferrer 200A may be disposed on a first side of the airflow stage 110. For example, the first substrate transferrer 200A may be disposed on the outside of, and near, a first long side (e.g., the left side) of the airflow stage 110.

For example, the second substrate transferrer 200B may be disposed on the outside of a second side of the airflow stage 110 that is opposite to the first side of the airflow stage 110. For example, the second substrate transferrer 200B may be disposed on the outside of, and near, a second long side (e.g., the right side) of the airflow stage 110. The second substrate transferrer 200B may be disposed on the third guide unit 930.

The first substrate transferrer 200A may be disposed on the bottom surface (or lower surface) of a first edge part of a target substrate SUB, and the second substrate transferrer 200B may be disposed on the bottom surface (or lower surface) of a second edge part of the target substrate SUB that is opposite to the first edge part of the target substrate SUB. As the first and second substrate transferrers 200A and 200B fix edge portions (e.g., opposite edge portions) of the target substrate SUB, the target substrate SUB lifted up from the airflow stage 110 may be stably fixed.

The inkjet printing apparatus of FIG. 19 differs from the inkjet printing apparatus of FIG. 18 in that an electric field generating unit is disposed on sides (e.g., opposite sides) of a stage unit.

Referring to FIG. 19, an electric field generating unit 300_1 may include first and second electric field generators 300A and 300B. The first electric field generator 300A may have substantially the same configuration, structure, and layout as the first electric field generating unit 300 of FIG. 3. The second electric field generator 300B may have the same configuration and structure as the first electric field generating unit 300. Descriptions of the configuration and structure of the first and second electric field generators 300A and 300B may be replaced with the description of the substrate transferring unit 200, and the layout of the first and second electric field generators 300A and 300B relative to an airflow stage 110 will hereinafter be described.

An inkjet printing apparatus 1000 may further include a fourth guide unit 940, which is disposed on the outside of a third guide unit 930. The fourth guide unit 940 may extend in the direction in which the airflow stage 110 extends, i.e., in a first direction D1. The third guide unit 930 may be disposed between the airflow stage 110 and the fourth guide unit 940.

The electric field generating unit 300_1 may be disposed on sides (e.g., opposite sides) of the airflow stage 110. The electric field generating unit 300_1 may be disposed on the outside of first and second substrate transferrers 200A and 200B.

The first electric field generator 300A may be disposed on the outside of, and near, the first substrate transferrer 200A.

The second electric field generator 300B may be disposed on the outside of, and near, the second substrate transferrer 200B. The second electric field generator 300B may be disposed on the fourth guide unit 940.

Since the electric field generating unit 300_1 includes electric field generators, i.e., the first and second electric field generators 300A and 300B, electrode pads may be provided on sides (e.g., opposite sides) of the top surface (or upper surface) of the target substrate SUB to generate an electric field, and electric field application signals may be transmitted to sides (e.g., opposite sides) of the target substrate SUB via the first and second electric field generators 300A and 300B on sides (e.g., opposite sides) of the target substrate SUB. Accordingly, signal noise may be minimized by applying the electric field application signals to sides (e.g., opposite sides) of the target substrate SUB.

The inkjet printing apparatus of FIG. 20 differs from the inkjet printing apparatus of FIG. 19 in that a substrate transferring unit 200 is disposed on a side of the inkjet printing apparatus. The substrate transferring unit 200 may be disposed on the outside of, and near, the left side of an airflow stage 110. An electric field generating unit 300 may include first and second electric field generators 300A and 300B. The first electric field generator 300A may be disposed on the outside (e.g., on the left side) of the substrate transferring unit 200, and the second electric field generator 300B may be disposed on the outside of, and near, the right side of the airflow stage 110.

Various substrate transferring units and various electric field generating units of an inkjet printing apparatus will hereinafter be described with reference to FIGS. 21 through 28. For convenience, only substrate transferring units, electric field generating units, target substrates, and airflow stages are schematically illustrated.

Figure 21:
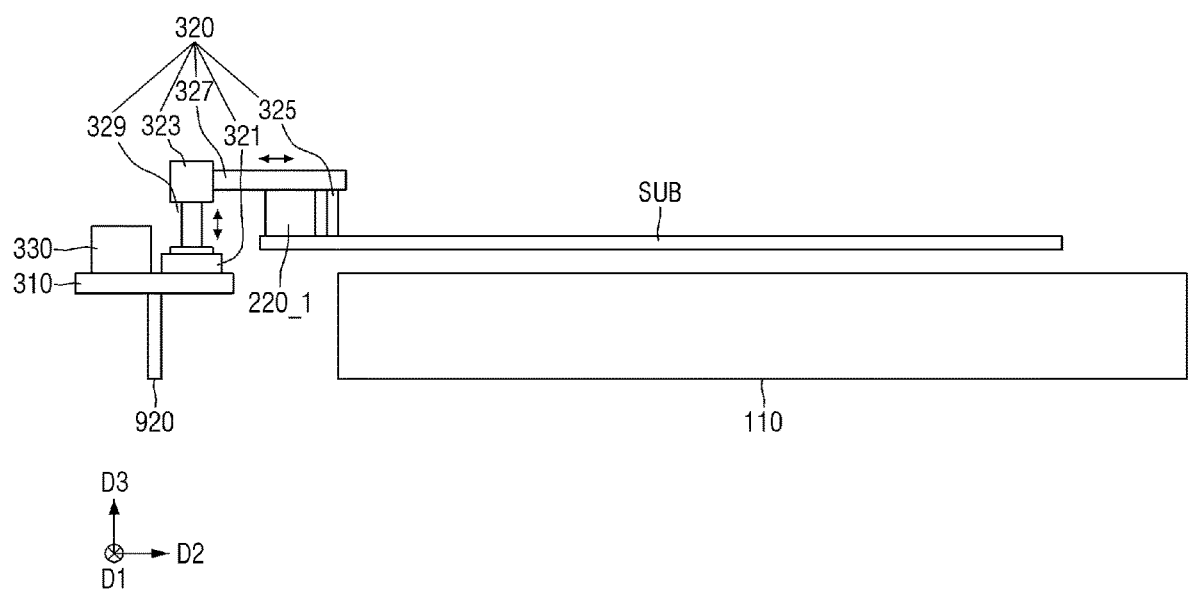
FIG. 21 is a schematic partial cross-sectional view of an inkjet printing apparatus according to an embodiment.

FIG. 21 is a schematic partial cross-sectional view of an inkjet printing apparatus according to an embodiment. FIG. 21 shows an example in which a gripper and a probe unit of an inkjet printing apparatus are integral with each other.

For example, a gripper 220_1 may be mounted on a probe horizontal mover 327 of a probe unit 320. The gripper 220_1 may be mounted on the probe horizontal mover 327 and may fix a target substrate SUB by generating negative pressure. The negative pressure may be formed by sucking the air between the gripper 220_1 and the top surface (or upper surface) of the target substrate SUB in a third direction D3.

Figure 22:
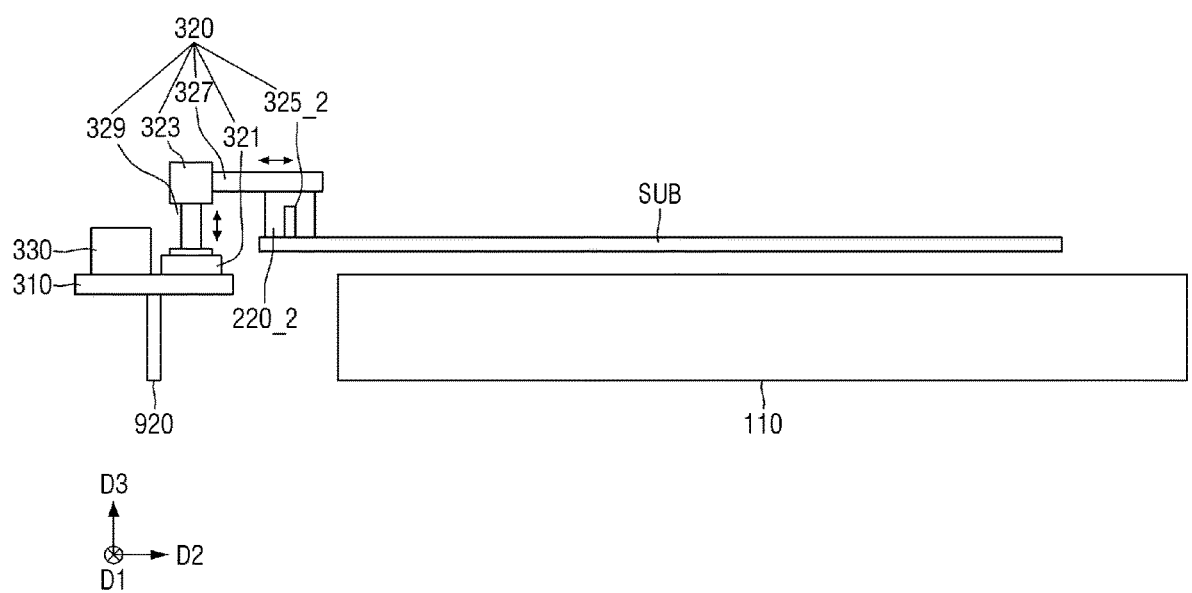
FIG. 22 is a schematic partial cross-sectional view of an inkjet printing apparatus according to an embodiment.

FIG. 22 is a schematic partial cross-sectional view of an inkjet printing apparatus according to an embodiment. FIGS.

Figure 23:
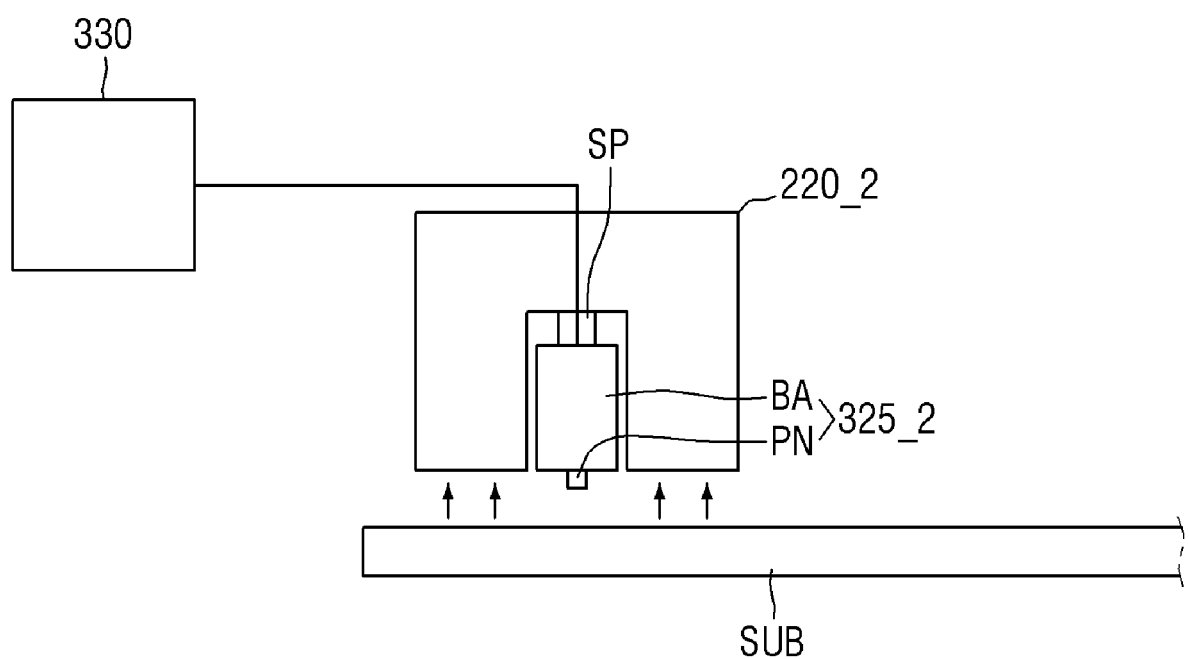
FIGS. 23 and 24 are schematic enlarged cross-sectional views illustrating how to drive a gripper and a probe unit of FIG. 22.
Figure 24:
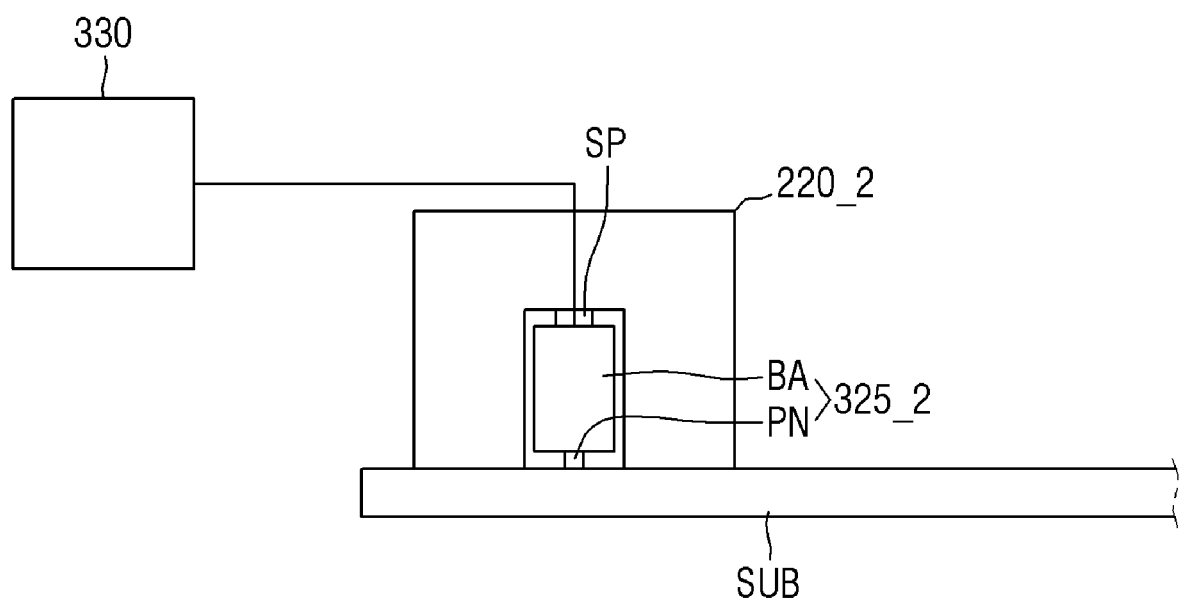

23 and 24 are schematic enlarged cross-sectional views illustrating how to drive a gripper and a probe unit of FIG. 22. FIGS. 22 through 24 show that a probe jig is disposed in, and incorporated into, a gripper.

Referring to FIGS. 22 through 24, a probe jig 325_2 may be disposed in a groove in a gripper 220_2. The groove may be formed on the bottom surface (or lower surface) of the gripper 220_2. The probe jig 325_2 may be formed in the groove on the bottom surface (or lower surface) of the gripper 220_2. A buffer member SP may be further disposed between the probe jig 325_2 and the gripper 220_2. The buffer member SP may function that the probe jig 325_2 is movable in a third direction D3 in a case where a target substrate SUB is adhered and fixed onto the bottom surfaces (or lower surfaces) of the probe jig 325_2 and the gripper 220_2 by the gripper 220_2.

The probe jig 325_2 may include a probe base BA and a probe pin PN. The probe base BA may transmit electrical signals from a probe driving device 330 to the probe pin PN. The probe pin PN may be in contact with the target substrate SUB and may transmit electrical signals by being in contact with (e.g., in direct contact with) electrode pads formed on the top surface (or upper surface) of the target substrate SUB.

Figure 25:
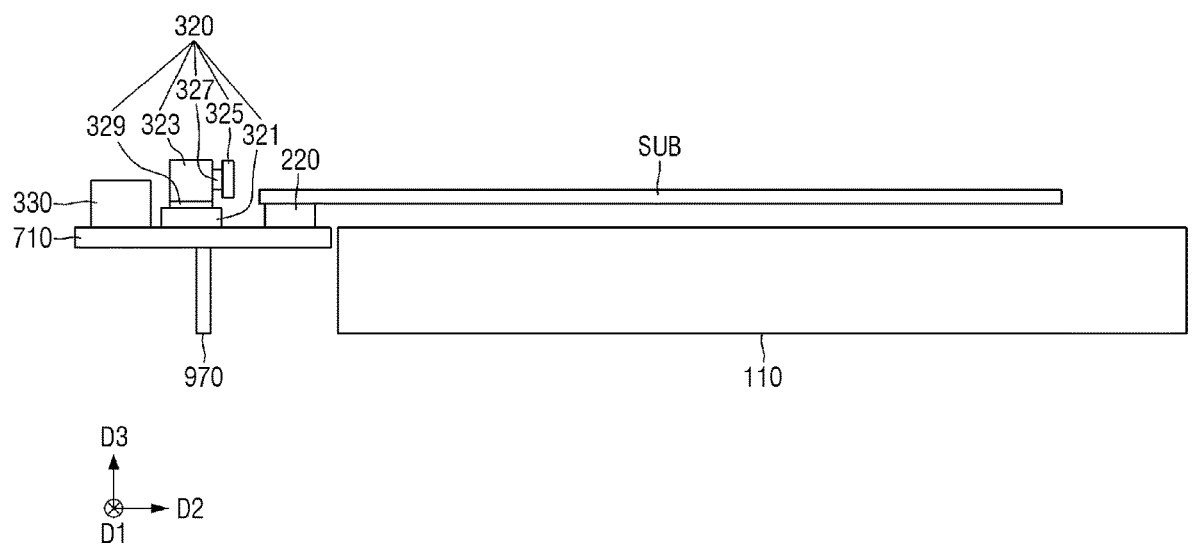
FIG. 25 is a schematic partial cross-sectional view of an inkjet printing apparatus according to an embodiment.

FIG. 25 is a schematic partial cross-sectional view of an inkjet printing apparatus according to an embodiment. FIG. 25 shows that a gripper 220, a probe unit 320, and a probe driving device 330 are disposed together on a single base substrate.

Referring to FIG. 25, the inkjet printing apparatus may include a fifth guide unit 970. The fifth guide unit 970 may be substantially the same as the first guide unit 910 of any one of the embodiments. A base substrate 710 may be disposed on the fifth guide unit 970. The gripper 220, the probe unit 320, and the probe driving device 330 may be disposed on the base substrate 710. The gripper 220, the probe unit 320, and the probe driving device 330 may be sequentially disposed on the base substrate 710 in a direction from an airflow stage 110 to the outside.

The gripper 220, the probe unit 320, and the probe driving device 330, which are disposed on the same base substrate, e.g., the base substrate 710, may be movable as one body in a first direction D1.

Figure 26:
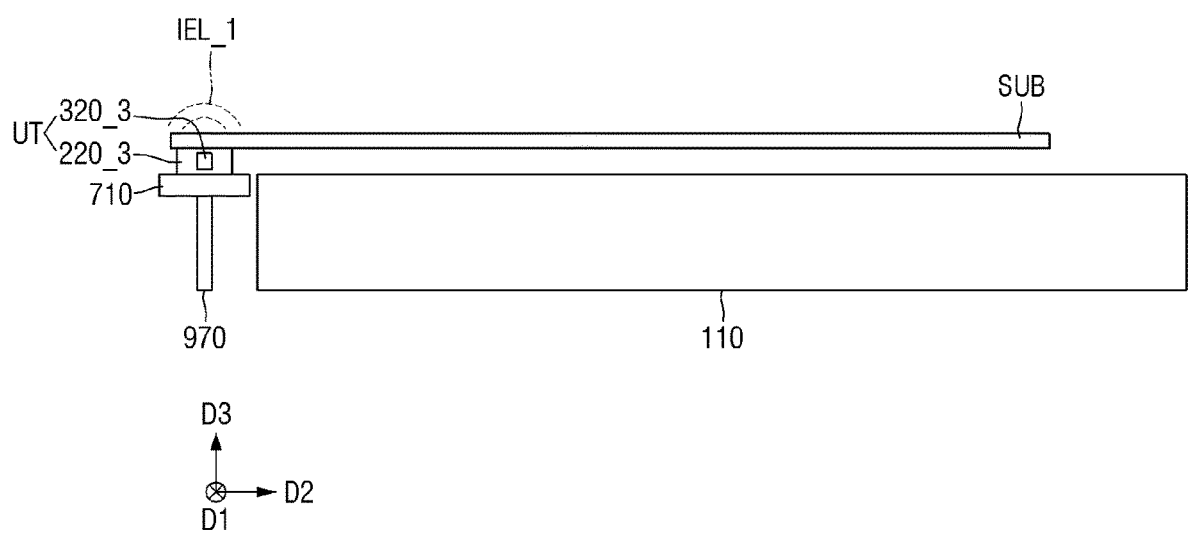
FIG. 26 is a schematic partial cross-sectional view of an inkjet printing apparatus according to an embodiment.
Figure 27:
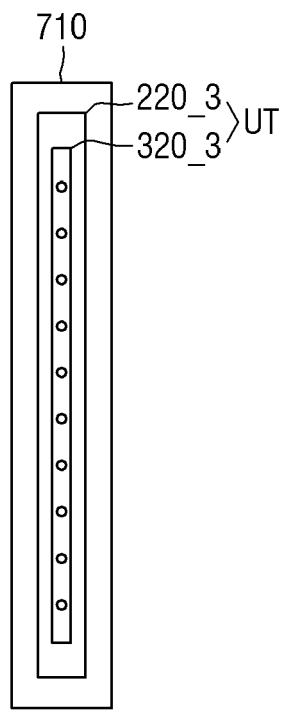
FIG. 27 is a schematic plan view of examples of a gripper and a probe unit of FIG. 26.

FIG. 26 is a schematic partial cross-sectional view of an inkjet printing apparatus according to an embodiment. FIG. 27 is a schematic plan view of examples of a gripper and a probe unit of FIG. 26.

Referring to FIGS. 26 and 27, the inkjet printing apparatus may include a unit UT, and the unit UT may include a gripper 220_3 and a probe unit 320_3, which is disposed in the gripper 220_3 and generates an electric field on a target substrate SUB without being in contact with the target substrate SUB. The unit UT may be disposed on a base substrate 710, which is disposed on a fifth guide unit 970. The unit UT may be disposed below the target substrate SUB, may fix the target substrate SUB by sucking the air below the bottom surface (or lower surface) of the target substrate SUB, and may apply an electric field IEL_1 onto the target substrate SUB.

The probe unit 320_3 may extend in a first direction D1. The probe unit 320_3 may include a wireless application device, which is capable of generating an electric field in a wireless manner without being in contact with the target substrate SUB. For example, the probe unit 320_3 may include a coil, a pad, or the like.

Figure 28:
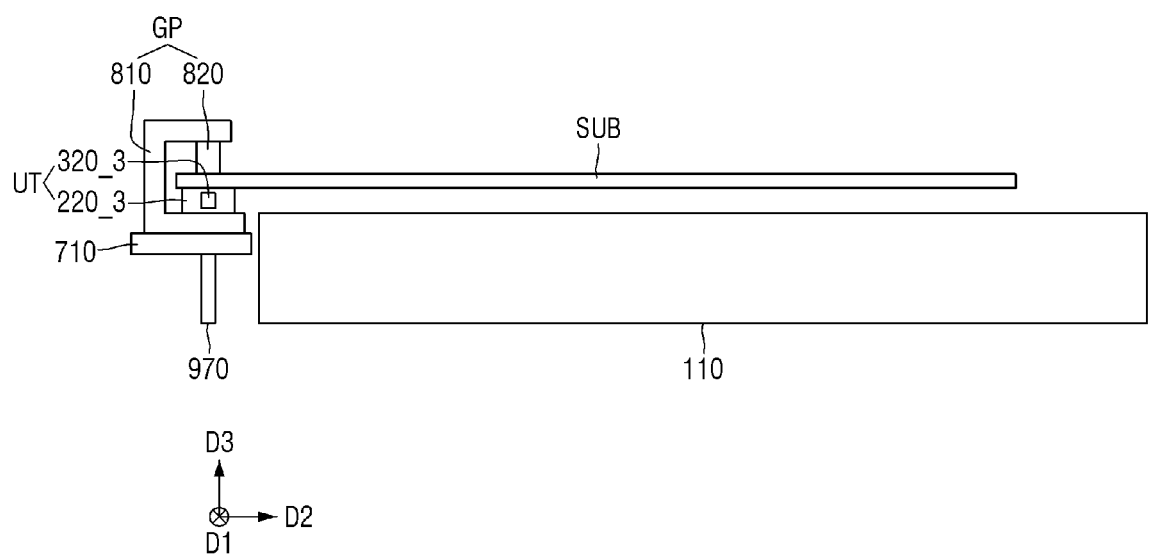
FIG. 28 is a schematic partial cross-sectional view of an inkjet printing apparatus according to an embodiment.

FIG. 28 is a schematic partial cross-sectional view of an inkjet printing apparatus according to an embodiment.

The embodiment of FIG. 28 differs from the embodiment of FIG. 27 in that an auxiliary gripper GP is further disposed on a base substrate 710. For example, the auxiliary gripper GP may be disposed on the base substrate 710.

The auxiliary gripper GP may include a base 810 and a fixer 820.

The base 810 may be disposed on the base substrate 710. An end portion of the base 810 may be disposed on the top surface (or upper surface) of the target substrate SUB, and another end portion of the base 810 may be disposed on the bottom surface (or lower surface) of the target substrate SUB. The base 810 may have a "U" (or "C") shape in a schematic cross-sectional view and may include space. Part of the target substrate SUB may be disposed in the space of the base 810.

The fixer 820 may be disposed at an end portion of the base 810. The fixer 820 may be fixed to an end portion of the base 810, from below the corresponding end portion of the base 810. The fixer 820 may be disposed between the target substrate SUB and the base 810, above the target substrate SUB, and may fix the top surface (or upper surface) of the target substrate SUB.

Figure 29:
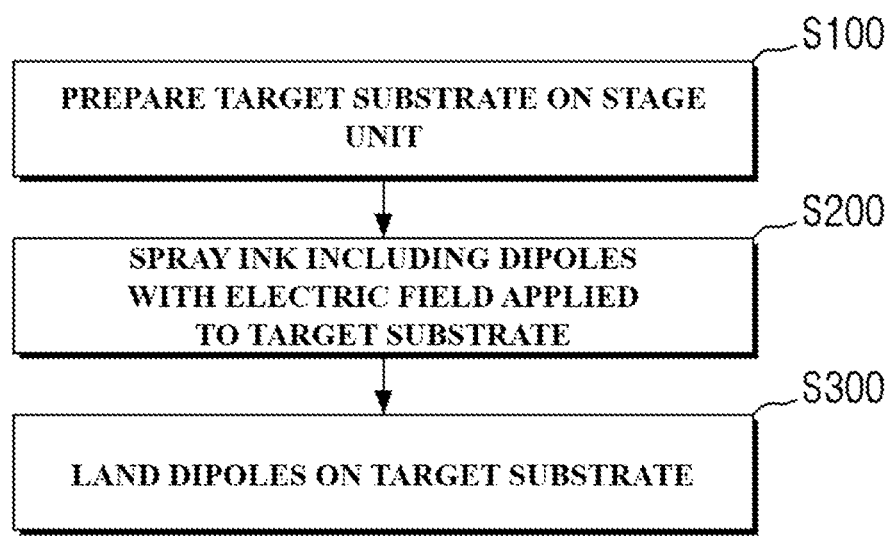
FIG. 29 is a flowchart illustrating a method of aligning dipoles by using an inkjet printing apparatus, according to an embodiment.

FIG. 29 is a flowchart illustrating a method of aligning dipoles by using an inkjet printing apparatus, according to an embodiment. FIGS. 30 through 33 are schematic views illustrating the method of FIG. 29.

Referring to FIGS. 1 through 3 and 29, the method may include the steps of: preparing a target substrate SUB on a stage unit 100 of an inkjet printing apparatus (S100); spraying ink I, including dipoles DP, onto the target substrate SUB with an electric field applied to the target substrate SUB (S200); and landing the dipoles DP on the target substrate SUB (S300).

The step of preparing the target substrate SUB on the stage unit 100 of the inkjet printing apparatus (i.e., S100 of FIG. 29) is the step of mounting the target substrate SUB on an airflow stage 110 of the stage unit 100 and fixing the target substrate SUB to a gripper 220 by spraying the air onto the bottom surface (or lower surface) of the target substrate SUB to lift up the target substrate SUB.

For example, the target substrate SUB may be mounted on the airflow stage 110. The target substrate SUB may be disposed on the top surface (or upper surface) of the airflow stage 110 by a separate moving member. Thereafter, the target substrate SUB may be lifted up in a third direction D3 from the top surface (or upper surface) of the airflow stage 110 by spraying the air onto the bottom surface (or lower surface) of the target substrate SUB through air holes AH formed on the top surface (or upper surface) of the airflow stage 110. Thereafter, the gripper 220 may be disposed on the bottom surface (or lower surface) of an edge part of the target substrate SUB, and the target substrate SUB may be fixed to the gripper 220 by negative pressure from the gripper 220. Thereafter, the target substrate SUB may be aligned with a reference position by performing an alignment check of the target substrate SUB with the use of an alignment checking unit 400.

Figure 30:
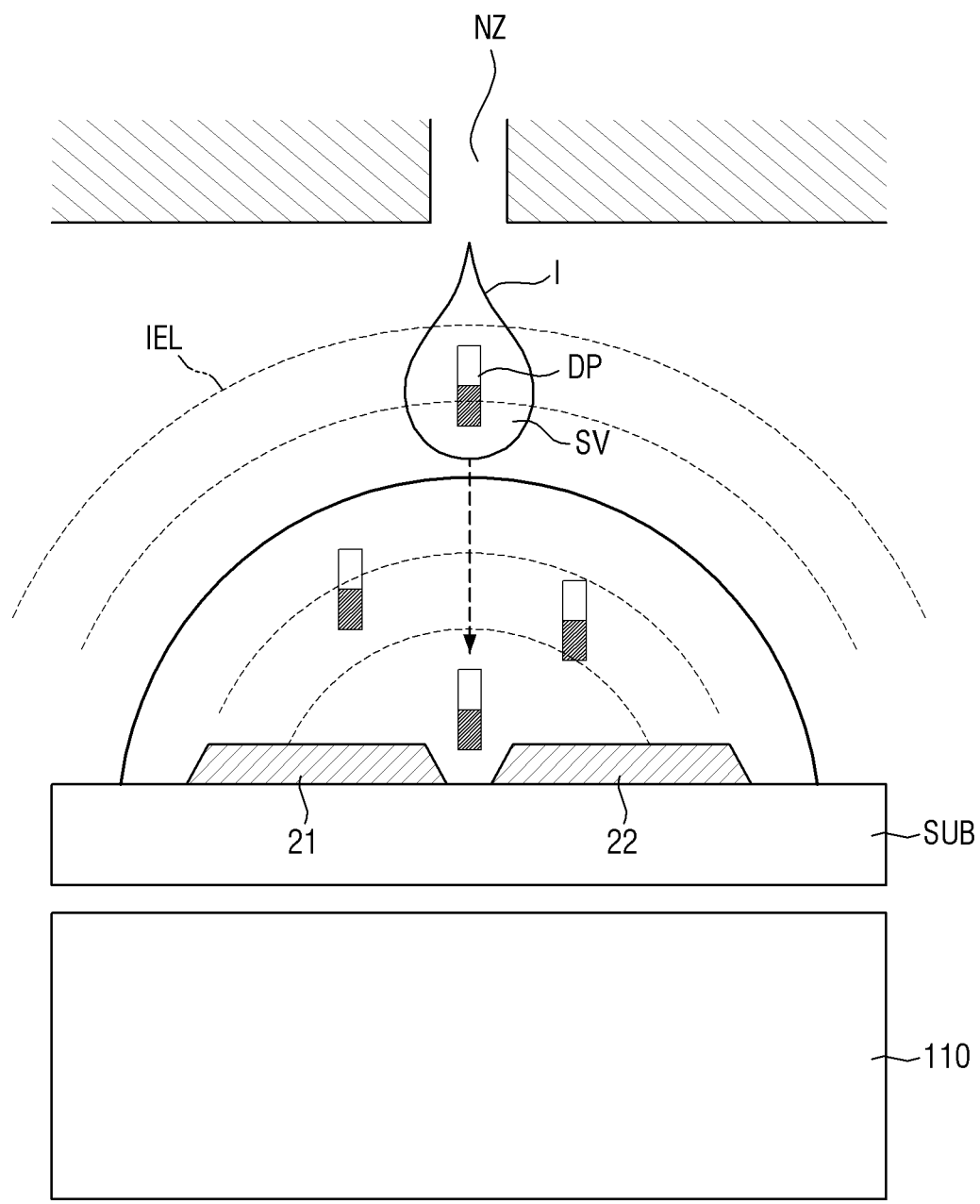
FIGS. 30 through 33 are schematic views illustrating the method of FIG. 29.
Figure 31:
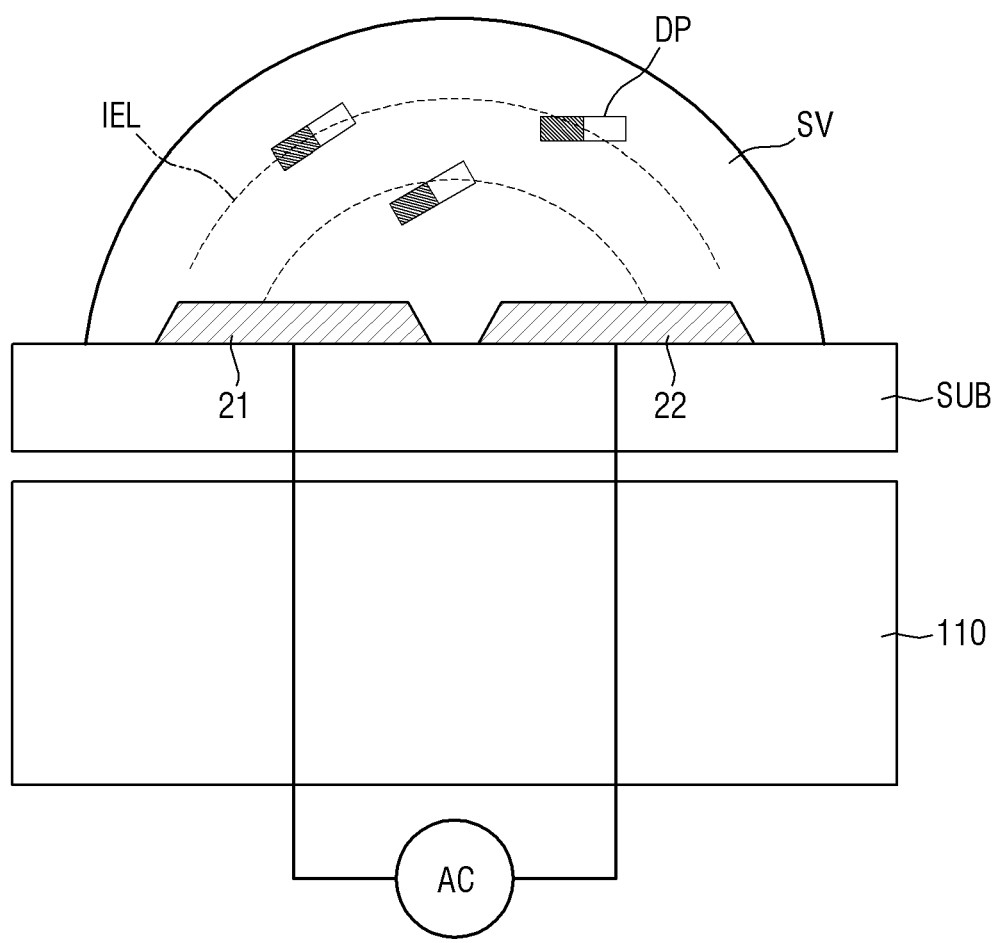

After the alignment of the target substrate SUB is complete, the ink I, including the dipoles DP, may be sprayed onto the target substrate SUB (S200 of FIG. 29) as illustrated in FIG. 30.

First and second electrodes 21 and 22 may be formed on the target substrate SUB, and the ink I may be sprayed onto the first and second electrodes 21 and 22. As mentioned above, as an electric field IEL is generated in a vertical direction via an electric field generating unit 300, the ink I may pass through a region where the electric field IEL is generated, and the dipoles DP may be aligned substantially in the vertical direction in a solvent SV. The ink I is illustrated as being sprayed onto a pair of electrodes, but embodiments are not limited thereto. For example, more than one pair of electrodes may be formed on the target substrate SUB, and the ink I may be sprayed onto each pair of electrodes by moving the target substrate SUB, lifted up from the airflow stage 110, in a first direction D1 and by moving nozzles NZ of a print head 520 of a print head unit 500.

Thereafter, the step of landing the dipoles DP onto the target substrate SUB may be performed. The landing of the dipoles DP may be performed by dielectrophoresis. For example, referring to FIG. 31, an alternating current voltage or a direct current voltage is applied to the first and second electrodes 21 and 22. In an embodiment, in a case where an alternating current voltage is applied to the first and second electrodes 21 and 22, the alternating current voltage may be about ±(10~50) V and may have a frequency of about 10 kHZ to about 1 MHz, but embodiments are not limited thereto.

The alternating current voltage may be applied by using the electric field generating unit 300. A probe driving device 330 of the electric field generating unit 300 may include a function generator and an amplifier, which are for generating an appropriate alternating current voltage. For example, a signal having a certain alternating waveform and a certain frequency may be generated by the function generator, the generated signal may be amplified by the amplifier, and the amplified signal may be provided to a probe jig 325 of a probe unit 320.

The first and second electrodes 21 and 22 may be connected to electrode pads provided on at least one side of the target substrate SUB, and the alternating current voltage may be applied to the electrode pads via the probe jig 325 of the probe unit 320. In a case where the probe unit 320 is disposed on only one side of the airflow stage 110, the electrode pads for the first and second electrodes 21 and 22 may be disposed on only one side of the target substrate SUB. The alternating current voltage may be applied to the electrode pads on a side of the target substrate SUB by the probe unit 320, but embodiments are not limited thereto. In another example, in a case where multiple probe units 320 are disposed on sides (e.g., opposite sides) of the airflow stage 110, electrode pads may be provided on sides (e.g., opposite sides) of the target substrate SUB. For example, the multiple probe units 320 may apply the alternating current voltage at the same time or one after another.

Figure 32:
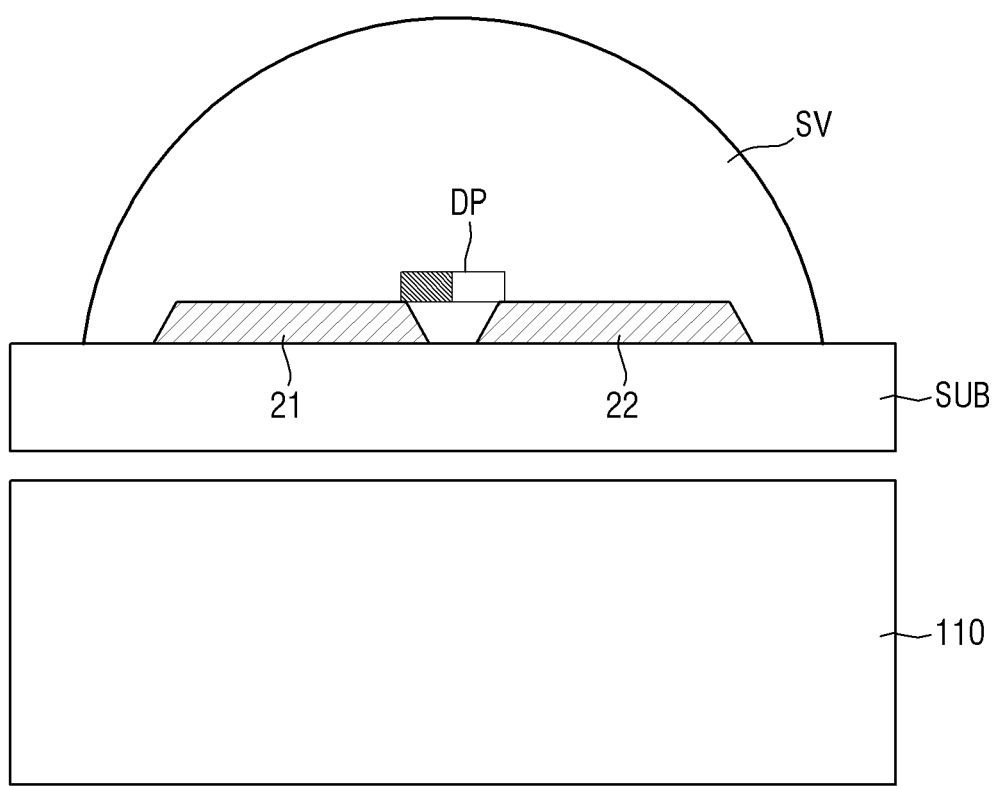

As the alternating current voltage is applied to the first and second electrodes 21 and 22, an electric field IEF may be generated between the first and second electrodes 21 and 22, and a dielectrophoretic force may be applied by the electric field IEF. As the dipoles DP receive the dielectrophoretic force, the orientation direction and the position of the dipoles DP may be slightly changed, and as a result, the dipoles DP may be landed finally such that end portions (e.g., opposite end portions) of each of the dipoles DP may be in contact with the first and second electrodes 21 and 22, as illustrated in FIG. 32. As mentioned above, in case that the dielectrophoretic force is applied, the dipoles DP may be aligned in a certain orientation direction, and the movement of the dipoles DP by the dielectrophoretic force may be performed in a substantially similar manner. As a result, the accuracy of the alignment of the landed dipoles DP may increase. As mentioned above, as the electric field IEL is generated by applying the alternating current voltage to the first and second electrodes 21 and 22 in the step of spraying the ink I, before the landing of the dipoles DP onto the first and second electrodes 21 and 22, the accuracy of alignment of the dipoles DP may be improved.

Figure 33:
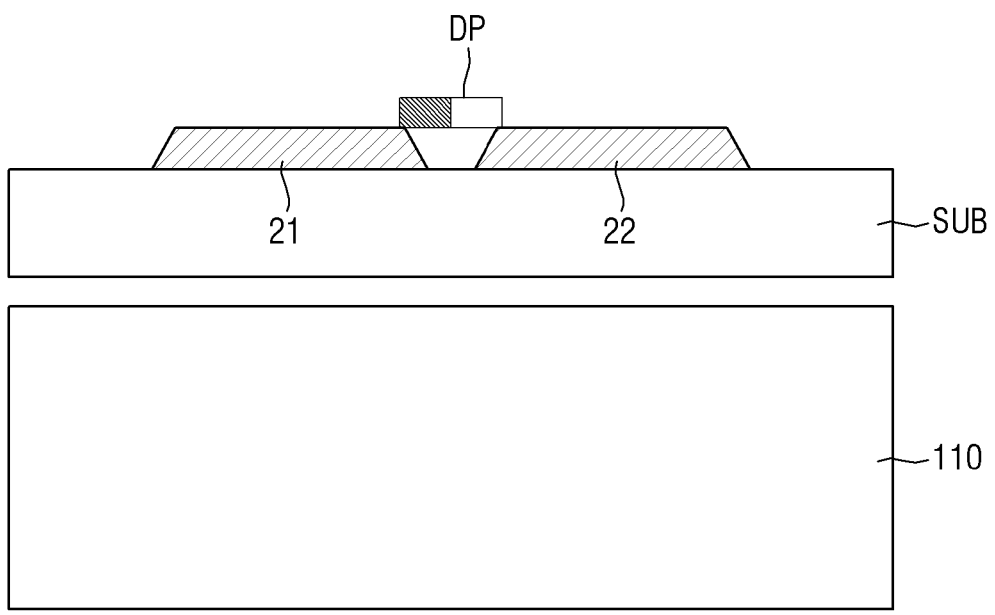

Thereafter, as illustrated in FIG. 33, the solvent SV of the ink I may be volatilized or vaporized and may thus be removed. As the solvent SV is removed, any flow (or movement) between the dipoles DP and the electrodes may be prevented, and the bonding force therebetween may be enhanced. As a result, the dipoles DP may be precisely aligned between the first and second electrodes 21 and 22.

The inkjet printing apparatus 1000 and the method of aligning the dipoles DP may be used to fabricate a display device including light-emitting elements, which are dipoles DP. This will hereinafter be described.

Figure 34:
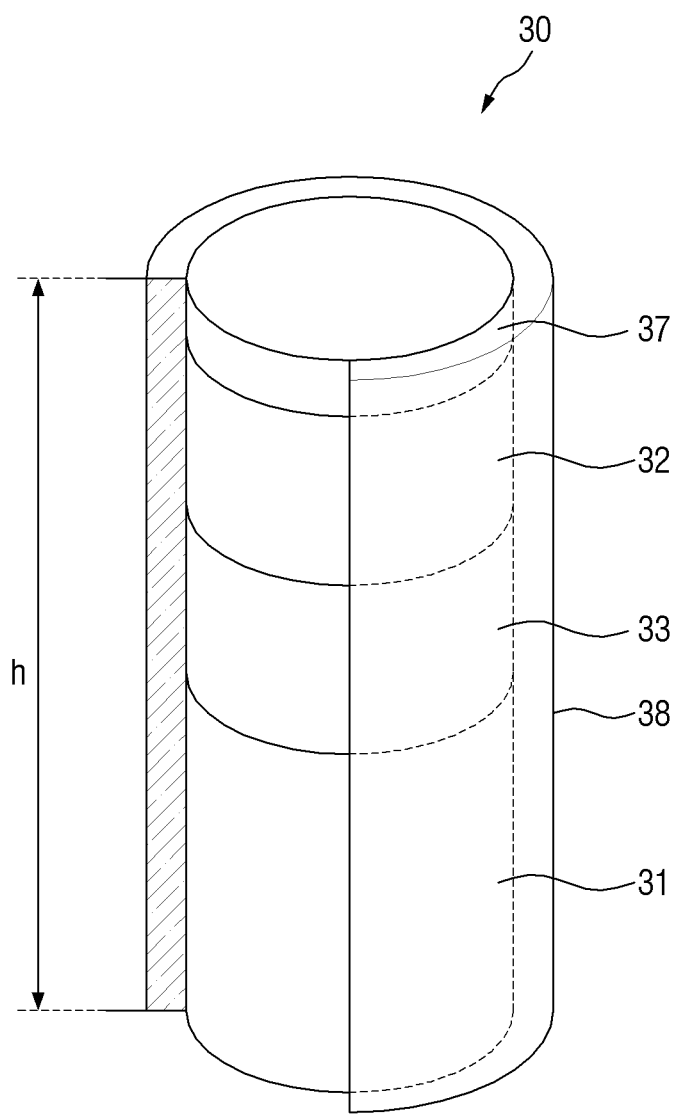
FIG. 34 is a schematic view of a light-emitting element according to an embodiment.

FIG. 34 is a schematic view of a light-emitting element according to an embodiment.

Referring to FIG. 34, a light-emitting element 30 may include semiconductor crystals doped with impurities of an arbitrary conductivity type (e.g., a p type dopant or an n type dopant). The semiconductor crystals may receive electrical signals from an external power source and may thus emit light of a certain wavelength band.

The light-emitting element 30 may be a light-emitting diode, e.g., an inorganic light-emitting diode having a size of several micrometers or nanometers and formed of an inorganic material. In a case where the light-emitting element 30 is an inorganic light-emitting diode, the inorganic light-emitting diode may be aligned between two opposing electrodes where polarities are generated, in response to an electric field being generated between the two opposing electrodes in a certain direction. The light-emitting element 30 may receive electrical signals from the electrodes and may thus emit light of a certain wavelength band.

Referring to FIG. 34, the light-emitting element 30 may include conductive semiconductors (e.g., 31 and 32), an active layer 33, an electrode material layer 37, and an insulating film 38. The conductive semiconductors (e.g., 31 and 32) may transmit electrical signals, applied to the light-emitting element 30, to the active layer 33, and the active layer 33 may emit light of a certain wavelength band.

For example, the light-emitting element 30 may include a first conductivity type semiconductor 31, a second conductivity type semiconductor 32, an active layer 33 disposed between the first and second conductivity type semiconductors 31 and 32, an electrode material layer 37 disposed on the second conductivity type semiconductor 32, and an insulating film 38 disposed to surround the rest of the light-emitting element 30.

The first conductivity type semiconductor 31 may be an n-type semiconductor layer. The first conductivity type semiconductor 31 may be doped with a first conductive dopant. For example, the first conductive dopant may be Si, Ge, Sn, or the like.

The second conductivity type semiconductor 32 may be a p-type semiconductor layer. The second conductivity type semiconductor 32 may be doped with a second conductive dopant. For example, the second conductive dopant may be Mg, Zn, Ca, Se, Ba, or the like.

The active layer 33 may be disposed between the first and second conductivity type semiconductors 31 and 32 and may include a material having a single- or multi-quantum well structure. In a case where the active layer 33 includes a material having a multi-quantum well structure, the active layer 33 may have a structure in which quantum layers and well layers are alternately stacked. The active layer 33 may emit light through the combination of electron-hole pairs in response to electrical signals being applied thereto through the first and second conductivity type semiconductors 31 and 32.

The light emitted from the active layer 33 may be output through the side of the active layer 33 in the length direction of the light-emitting element 30 and the sides of the active layer 33 at end portions (e.g., opposite end portions) of the light-emitting element 30. The direction in which light is emitted from the active layer 33 is not limited thereto.

The electrode material layer 37 may be an ohmic contact electrode, but embodiments are not limited thereto. In another example, the electrode material layer 37 may be a Schottky contact electrode. The electrode material layer 37 may include a metal with conductivity.

The insulating film 38 may be formed to be in contact with the first conductivity type semiconductor 31, the second conductivity type semiconductor 32, the active layer 33, and the electrode material layer 37 and to surround the outer surfaces of the first conductivity type semiconductor 31, the second conductivity type semiconductor 32, the active layer 33, and the electrode material layer 37. The insulating film 38 may protect the other elements of the light-emitting element 30. As the insulating film 38 protects the outer surfaces of the light-emitting element 30 including that of the active layer 33, the degradation of the efficiency of emitting light may be prevented.

Figure 35:
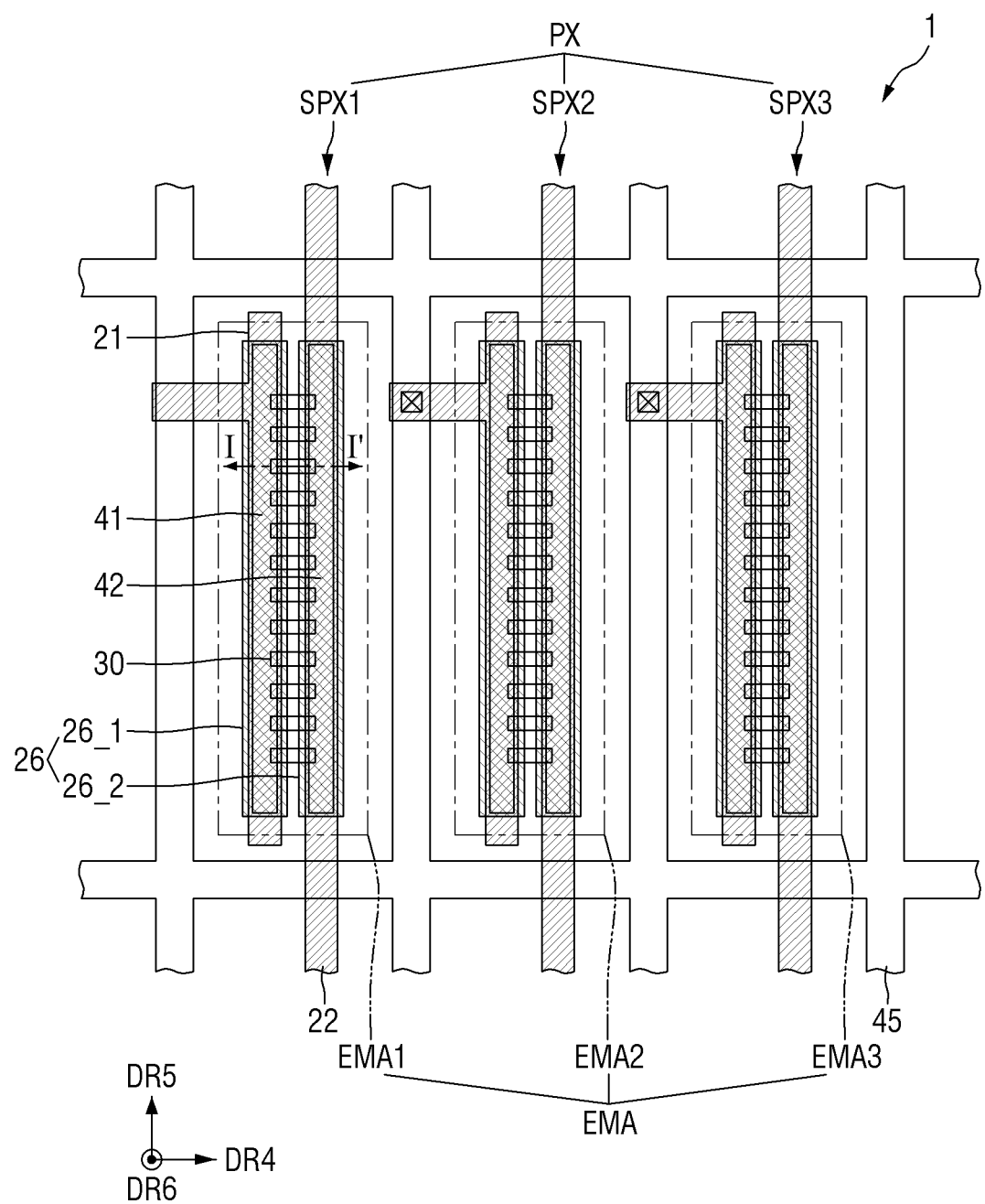
FIG. 35 is a schematic plan view of a display device fabricated by a method according to an embodiment.

FIG. 35 is a schematic plan view of a display device fabricated by a method according to an embodiment.

Referring to FIG. 35, a display device 1 may include a pixel PX. The pixel PX of the display device 1 may include subpixels (e.g., SPX1, SPX2, and SPX3). The pixel PX may include first, second, and third subpixels SPX1, SPX2, and SPX3.

The first subpixel SPX1 may emit light of a first color, the second subpixel SPX2 may emit light of a second color, and the third subpixel SPX3 may emit light of a third color. For example, the first color may be blue, the second color may be green, and the third color may be red. However, embodiments are not limited to this. In another example, each of subpixels SPXn may emit light of the same color. FIG. 2 illustrates that the pixel PX includes three subpixels SPXn, but embodiments are not limited thereto. In another example, the pixel PX may include more than three subpixels SPXn.

Each of the subpixels SPXn of the display device 1 may include an area defined as an emission area EMA. As light-emitting elements 30 included in the display device 1 are disposed in the emission area EMA, the emission area EMA may be defined as an area that emits light of a certain wavelength band. The first subpixel SPX1 may include a first emission area EMA1, the second subpixel SPX2 may include a second emission area EMA2, and the third subpixel SPX3 may include a third emission area EMA3.

The emission area EMA may include an area where the light-emitting elements 30 are disposed. For example, the emission area EMA may include an area where light emitted by the light-emitting elements 30 is reflected or refracted and output. For example, light-emitting elements 30 may be disposed in each of the subpixels SPXn, and an area where the light-emitting elements 30 are disposed and the surroundings of the area where the light-emitting elements 30 are disposed may form the emission area EMA.

Each of the subpixels SPXn may include a non-emission area, which is defined as an area other than the emission area EMA. The non-emission area may be an area that is not reached by light emitted from the light-emitting elements 30 and thus may not output light due to the absence of the light-emitting elements 30 therein.

Each of the subpixels SPXn of the display device 10 may include light-emitting elements 30, electrodes (e.g., 21 and 22), contact electrodes 26, inner banks (e.g., 41 and 40), and an outer bank 45.

The outer bank 45 may divide (or define) the subpixels SPXn. The outer bank 45 may be disposed along the boundaries between the subpixels SPXn. The outer bank 45 may form a lattice pattern in a display area (e.g., an entire display area).

The inner banks (e.g., 41 and 42) may include first and second inner banks 41 and 42, which are disposed adjacent to each other in the middle of the pixel PX or each of the subpixels SPXn.

The first and second inner banks 41 and 42 may extend in a fifth direction DR5 and may be spaced apart from, and terminated at, the boundaries of the corresponding subpixel SPXn not to extend into other neighboring subpixels SPXn. Accordingly, the first and second inner banks 41 and 42 may be disposed in each of the subpixels SPXn to form a pattern on the front surface (or the entire surface) of the display device 1.

The first and second inner banks 41 and 42 may be spaced apart from each other in a fifth direction DR5. Light-emitting elements 30 may be disposed in the gap between the first and second inner banks 41 and 42 in the fifth direction DR5.

The display device 1 may include electrodes (e.g., 21 and 22). At least parts of the electrodes (e.g., 21 and 22) may be disposed in each of the subpixels SPXn, may be connected (e.g., electrically connected) to the light-emitting elements 30, and may apply electrical signals to the light-emitting elements 30 such that the light-emitting elements 30 may emit light of a certain color.

For example, at least parts of the electrodes (e.g., 21 and 22) may function to generate an electric field in each of the subpixels SPXn and thus to align the light-emitting elements 30. As mentioned above, dielectrophoresis may be used to align the light-emitting elements 30, which are a type of dipoles, and an alternating current voltage may be applied to the electrodes (e.g., 21 and 22).

The electrodes (e.g., 21 and 22) may include first and second electrodes 21 and 22.

The first electrode 21 may extend in the fifth direction DR5. The first electrode 21 may extend in the fifth direction DR5 and may be spaced apart from, and terminated at, the boundaries of the corresponding subpixel SPXn not to extend into other neighboring subpixels SPXn in the fifth direction DR5.

The first electrode 21 may be disposed on the first inner bank 41, in each of the subpixels SPXn. The first electrode 21 may be disposed to overlap the first inner bank 41.

The second electrode 22 may extend in the fifth direction DR5. The second electrode 22 may be disposed to extend into other neighboring subpixels SPXn in the fifth direction DR5. For example, one second electrode 22 may be disposed in and across multiple subpixels SPXn that are adjacent to one another in the fifth direction DR5.

The second electrode 22 may be disposed on the second inner bank 42, in each of the subpixels SPXn. The second electrode 22 may be disposed to overlap the second inner bank 42.

The electrodes (e.g., 21 and 22) may be connected (e.g., electrically connected) to the light-emitting elements 30 and may receive a voltage to emit light by the light-emitting elements 30. For example, the electrodes (e.g., 21 and 22)

may be connected (e.g., electrically connected) to the light-emitting elements 30 through the contact electrodes 26 that will be described below, and may transmit electrical signals, applied to the electrodes (e.g., 21 and 22), to the light-emitting elements 30 through the contact electrodes 26.

The light-emitting elements 30 may be sprayed onto the first and second electrodes 21 and 22 by an inkjet printing process in a state of being dispersed in ink. The light-emitting elements 30 sprayed in the state of being dispersed in the ink may be aligned between the first and second electrodes 21 and 22 by a dielectrophoretic force, which is formed by applying alignment signals to the first and second electrodes 21 and 22.

Contact electrodes 26 may be disposed on the electrodes (e.g., 21 and 22). The contact electrodes 26 may extend in a direction. The contact electrodes 26 may be in contact with the light-emitting elements 30 and the electrodes (e.g., 21 and 22), and the light-emitting elements 30 may receive electrical signals from the first and second electrodes 21 and 22 through the contact electrodes 26.

The contact electrodes 26 may include first and second contact electrodes 26_1 and 26_2. The first and second contact electrodes 26_1 and 26_2 may be disposed on the first and second electrodes 21 and 22, respectively. The first and second contact electrodes 26_1 and 26_2 may extend in the fifth direction DR5. The first and second contact electrodes 26_1 and 26_2 may be spaced apart from, and face, each other in a fourth direction DR4 and may form a stripe pattern in the emission area EMA of each of the subpixels SPXn.

Figure 36:
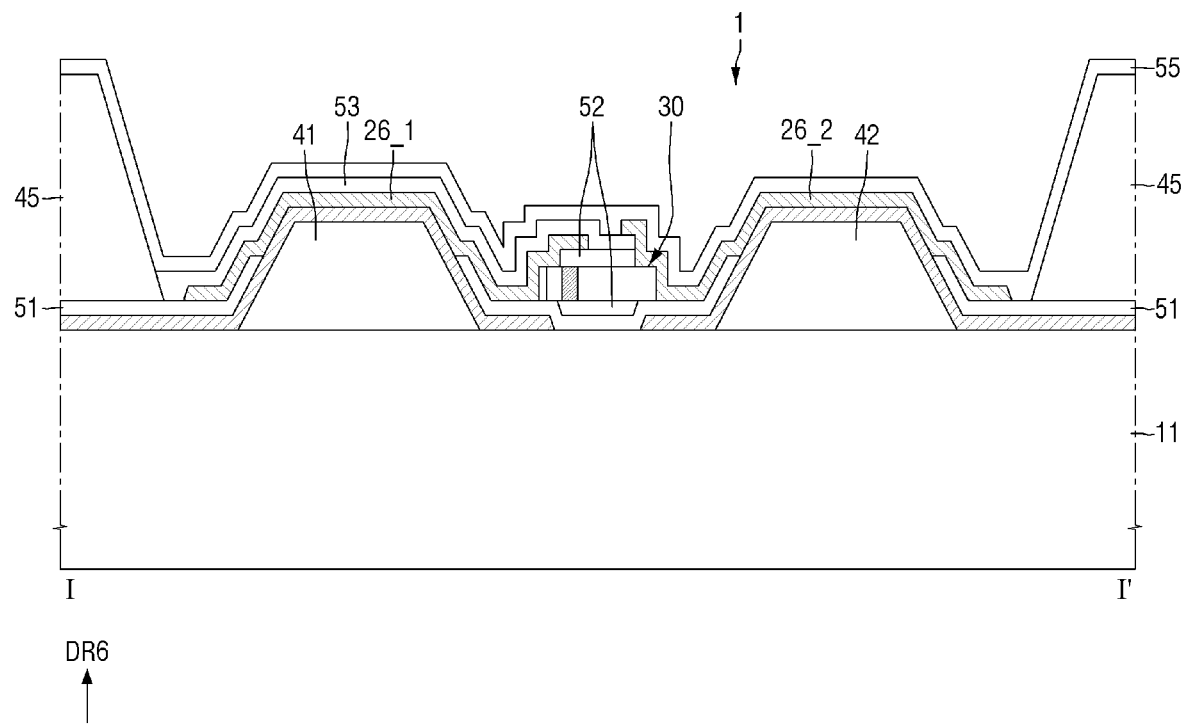
FIG. 36 is a schematic partial cross-sectional view taken along line I-I' of FIG. 35.

FIG. 36 is a schematic partial cross-sectional view taken along line I-I' of FIG. 35.

Referring to FIGS. 35 and 36, the display device 1 may include a substrate 11 and a display element layer, which is disposed on the substrate 11. For example, the display device 1 may further include a circuit element layer, which is between the substrate 11 and the display element layer and drives the display element layer.

The substrate 11 may be an insulating substrate. The substrate 11 may be formed of an insulating material such as glass, quartz, a polymer resin, or the like. The substrate 11 may be a rigid substrate or may be a flexible substrate that is bendable, foldable, or rollable.

The display element layer may be disposed on the substrate 11. The display element layer may include the light-emitting elements 30 and may include the first electrode 21, the second electrode 22, the first contact electrode 26_1, and the second contact electrode 26_2.

The inner banks (e.g., 41 and 42) may be disposed on the substrate 11. The first and second inner banks 41 and 42 may protrude at least partially from the top surface (or upper surface) of the substrate 11. Each of protruding parts of the first and second inner banks 41 and 42 may have inclined side surfaces, and light emitted from the light-emitting elements 30 may proceed toward the inclined side surfaces of each of the inner banks (e.g., 41 and 42).

As mentioned above, the inner banks (e.g., 41 and 42) may provide space in which to arrange the light-emitting elements 30 and may function as a reflective barrier capable of reflecting light, emitted from the light-emitting elements 30, in an upward direction. In an embodiment, the inner banks (e.g., 41 and 42) may include an organic insulating material such as polyimide (PI), but embodiments are not limited thereto.

The electrodes (e.g., 21 and 22) may be disposed on the inner banks (e.g., 41 and 42) and the substrate 11. The first and second electrodes 21 and 22 may be disposed to cover (e.g., completely cover) the outer surfaces of each of the first and second inner banks 41 and 42. At least parts of the first and second electrodes 21 and 22 may be disposed directly on the substrate 11.

The electrodes (e.g., 21 and 22) may include a transparent conductive material. For example, the electrodes (e.g., 21 and 22) may include a material such as indium tin oxide (ITO), indium zinc oxide (IZO), indium tin zinc oxide (ITZO), or the like, but embodiments are not limited thereto.

A first insulating layer 51 may be disposed on the substrate 11, the first electrode 21, and the second electrode 22. The first insulating layer 51 may be disposed in the gap between the electrodes (e.g., 21 and 22) or between the inner banks (e.g., 41 and 42). The first insulating layer 51 may be disposed on the opposite sides of the gap between the inner banks (e.g., 41 and 42).

The first insulating layer 51 may be disposed to cover (e.g., partially cover) the first and second electrodes 21 and 22. The first insulating layer 51 may protect the first and second electrodes 21 and 22 and may insulate the first and second electrodes 21 and 22 from each other. For example, the first insulating layer 51 may prevent the light-emitting elements 30 thereon from being disposed in direct contact with, and damaged by, other members. The shape and the structure of the first insulating layer 51 are not limited thereto.

The outer bank 45 may be disposed on the first insulating layer 51. The height of the outer bank 45 may be greater than the height of the inner banks (e.g., 41 and 42). As mentioned above, the outer bank 45 may divide (or define) the subpixels SPXn and may prevent ink from spilling over between the subpixels SPXn during an inkjet printing process for arranging the light-emitting elements 30, as performed during the fabrication of the display device 1. For example, the outer bank 45 may include PI, but embodiments are not limited thereto.

The light-emitting elements 30 may be disposed on the first insulating layer 51, between the inner banks (e.g., 41 and 42) or between the electrodes (e.g., 21 and 22). For example, the light-emitting elements 30 may be disposed on part of the first insulating layer 51 disposed between the inner banks (e.g., 41 and 42).

In each of the light-emitting elements 30, layers may be disposed in a direction perpendicular to the top surface (or upper surface) of the substrate 11. The light-emitting elements 30 of the display device 1 may extend in a direction and may have a structure in which semiconductor layers are sequentially arranged in a direction.

A second insulating layer 52 may be disposed on the light-emitting elements 30 and may expose end portions (e.g., opposite end portions) of each of the light-emitting elements 30. The exposed end portions of each of the light-emitting elements 30 may be in contact with the contact electrodes 26. The second insulating layer 52 may be formed by a typical mask process, e.g., a patterning process by using the material of the second insulating layer 52.

Contact electrodes 26 and a third insulating layer 53 may be disposed on the second insulating layer 52.

The first and second contact electrodes 26_1 and 26_2 may be in contact with first and second end portions of each of the light-emitting elements 30 and may be disposed to cover side surfaces (e.g., opposite side surfaces) of each of the first and second electrodes 21 and 22. As mentioned above, parts of the top surfaces (or upper surfaces) of the first and second electrodes 21 and 22 may be exposed, and the first and second contact electrodes 26_1 and 26_2 may be in contact with the exposed parts of the top surfaces (or upper surfaces) of the first and second electrodes 21 and 22.

The third insulating layer 53 may be disposed on the first contact electrode 26_1. The third insulating layer 53 may be disposed to cover the first contact electrode 26_1 and may not overlap parts of the light-emitting elements 30 such that the light-emitting elements 30 may be connected to the second contact electrode 26_2. The third insulating layer 53 may be partially in contact with the first contact electrode 26_1 and the second insulating layer 52, on the top surface (or upper surface) of the second insulating layer 52. The third insulating layer 53 may protect the first contact electrode 26_1 and may electrically insulate the first contact electrode 26_1 from the second contact electrode 26_2.

The second contact electrode 26_2 may be disposed on the second electrode 22, the second insulating layer 52, and the third insulating layer 53. The second contact electrode 26_2 may be in contact with the second end portions of the light-emitting elements 30 and the exposed part of the top surface (or upper surface) of the second electrode 22. The second end portions of the light-emitting elements 30 may be connected (e.g., electrically connected) to the second electrode 22 through the second contact electrode 26_2.

A fourth insulating layer 55 may be disposed (or entirely disposed) on the substrate 11. The fourth insulating layer 55 may protect the members disposed on the substrate 11 from an external environment.

The first, second, third, and fourth insulating layers 51, 52, 53, and 55 may include an inorganic insulating material or an organic insulating material.

In concluding the detailed description, those skilled in the art will appreciate that many variations and modifications may be made to the embodiments without substantially departing from the principles of the invention. Therefore, the disclosed embodiments of the invention are used in a generic and descriptive sense only and not for purposes of limitation.

What is claimed is:

1. An inkjet printing apparatus comprising:
   an airflow stage extending in a first direction;
   a print head unit disposed above the airflow stage;
   an electric field generating unit that moves in the first direction and generates an electric field on the airflow stage; and
   a substrate transferring unit that transfers a target substrate in the first direction over the airflow stage, wherein
   the electric field generating unit is configured to generate an electric field on the target substrate in case that the target substrate moves along with the substrate transferring unit,
   the electric field generating unit to apply an electric field to ink after it leaves the print head unit and both before and after the ink lands on the target substrate.

2. The inkjet printing apparatus of claim 1, wherein
   the print head unit includes a print head, and
   the print head includes nozzles that spray the ink including dipoles.

3. The inkjet printing apparatus of claim 2, wherein the print head is configured to spray the ink onto the airflow stage on which the electric field is formed.

4. The inkjet printing apparatus of claim 2, wherein the dipoles are light-emitting diodes used to produce a display device.

5. The inkjet printing apparatus of claim 1, wherein
   the airflow stage includes a plurality of air holes formed on an upper surface of the airflow stage, and
   at least some of the plurality of air holes is configured to discharge air onto the airflow stage.

6. The inkjet printing apparatus of claim 1, wherein the substrate transferring unit includes a first substrate transferrer disposed adjacent to a first side of the airflow stage in a second direction perpendicular to the first direction.

7. The inkjet printing apparatus of claim 6, wherein
   the first substrate transferrer further includes a gripper, and
   the gripper is configured to adsorb the target substrate onto a surface of the gripper by generating negative pressure between the gripper and the target substrate.

8. The inkjet printing apparatus of claim 6, wherein the substrate transferring unit further includes a second substrate transferrer disposed adjacent to a second side of the airflow stage opposite to the first side of the airflow stage.

9. The inkjet printing apparatus of claim 1, wherein the electric field generating unit includes a probe unit and a probe driving device that drives the probe unit.

10. The inkjet printing apparatus of claim 9, wherein
    the probe unit of the electric field generating unit is in contact with electrode pads on the target substrate, and
    the electric field generating unit to transfer electric signals to the target substrate to generate an electric field on the target substrate.

11. The inkjet printing apparatus of claim 1, wherein
    the electric field generating unit moves together with the substrate transferring unit in a same direction and at a synchronized speed while the electric field generating unit generates an electric field on the target substrate.

12. The inkjet printing apparatus of claim 1, wherein the electric field generating unit changes a direction of the electric field based on a change in state between the ink sprayed from the print head unit and the ink landing on the target substrate.

13. An inkjet printing apparatus comprising:
    an airflow stage extending in a first direction, the airflow stage including:
       a loading part sequentially arranged in the first direction, the loading part in which a target substrate is aligned, and
       a printing part upon which ink is sprayed onto the target substrate;
    a print head unit disposed above the printing part, the print head unit sprays the ink;
    an electric field generating unit disposed on a side of the airflow stage, the electric field generating unit generates an electric field on the target substrate in case that the target substrate moves in the first direction;
    a substrate transferring unit that transfers the target substrate in the first direction over the airflow stage, wherein
    the electric field generating unit is configured to generate an electric field on the target substrate in case that the target substrate moves along with the substrate transferring unit,
    the electric field generating unit to apply an electric field to the ink after it leaves the print head and both before and after the ink lands on the target substrate.

14. The inkjet printing apparatus of claim 13, wherein the substrate transferring unit is disposed adjacent to a first side of the airflow stage in a second direction perpendicular to the first direction.

15. The inkjet printing apparatus of claim 14, wherein
    the substrate transferring unit further includes a gripper, and the gripper is configured to adsorb a surface of the target substrate onto a surface of the gripper facing the surface of the target substrate by generating negative pressure between the gripper and the target substrate.

16. The inkjet printing apparatus of claim 13, wherein the electric field generating unit includes a probe unit and a probe driving device that drives the probe unit.

17. The inkjet printing apparatus of claim 13, wherein the airflow stage includes a plurality of air holes that lift up the target substrate by discharging air onto the airflow stage.

18. The inkjet printing apparatus of claim 13, further comprising:
an alignment checking unit disposed above the loading part.

19. The inkjet printing apparatus of claim 13, wherein the electric field generating unit changes a direction of the electric field based on a change in state between the ink sprayed from the print head unit and the ink landing on the target substrate.

20. An inkjet printing apparatus comprising:
an airflow stage extending in a first direction, the airflow stage including:
a loading part sequentially arranged in the first direction, the loading part in which a target substrate is aligned, and
a printing part upon which ink is sprayed onto the target substrate;
a print head unit disposed above the printing part, the print head unit sprays the ink;
an electric field generating unit disposed on a side of the airflow stage, the electric field generating unit generates an electric field on the target substrate in case that the target substrate moves in the first direction; and
a first guide unit extending in the first direction and disposed adjacent to a first side of the airflow stage in a second direction perpendicular to the first direction,
wherein the electric field generating unit includes:
a first base substrate disposed on the first guide unit,
a probe unit disposed on the first base substrate, and
a probe driving device spaced apart from the probe unit and disposed on the first base substrate.

21. The inkjet printing apparatus of claim 20, further comprising:
a second guide unit extending in the first direction and disposed between the first guide unit and the airflow stage; and
a substrate transferring unit that transfers the target substrate along the second guide unit over the airflow stage,
wherein the substrate transferring unit includes:
a second base substrate disposed on the second guide unit, and
a gripper disposed on the second base substrate and fixing the target substrate.

22. The inkjet printing apparatus of claim 20, further comprising:
a gripper disposed on the first base substrate, the gripper that transfers the target substrate in the first direction.

* * * * *